United States Patent
Kenney et al.

(10) Patent No.: US 6,921,943 B2
(45) Date of Patent: Jul. 26, 2005

(54) SYSTEM AND METHOD FOR REDUCING SOFT ERROR RATE UTILIZING CUSTOMIZED EPITAXIAL LAYERS

(75) Inventors: Danny Kenney, Sherman, TX (US); Keith Lindberg, Sherman, TX (US); Curtis Hall, Denison, TX (US); G. R. Mohan Rao, McKinney, TX (US)

(73) Assignee: GlobiTech Incorporated, Sherman, TX (US)

( * ) Notice: Subject to any disclaimer, the term of this patent is extended or adjusted under 35 U.S.C. 154(b) by 0 days.

(21) Appl. No.: 10/664,091

(22) Filed: Sep. 17, 2003

(65) Prior Publication Data

US 2004/0063288 A1 Apr. 1, 2004

Related U.S. Application Data

(60) Provisional application No. 60/411,815, filed on Sep. 18, 2002.

(51) Int. Cl.[7] .................. H01L 29/76; H01L 29/94; H01L 29/49; H01L 29/51; H01L 31/062
(52) U.S. Cl. .................. 257/340; 257/152; 257/153
(58) Field of Search .................. 257/340, 152, 257/153, 154, 242, 302, 335, 297

(56) References Cited

U.S. PATENT DOCUMENTS 4,216,489 A * 8/1980 Clemens et al. ............ 257/297
6,774,434 B2 * 8/2004 Hueting et al. ............. 257/340

OTHER PUBLICATIONS

John P. Uyemura, "Fundamentals of MOS Digital Integrated Circuits", 1988, Addison–Wesley Publishing Company, pp. 5–7.*

* cited by examiner

Primary Examiner—Michael Lebentritt
Assistant Examiner—Walter L. Lindsay, Jr.
(74) Attorney, Agent, or Firm—Rudolph J. Buchel, Jr., PC

(57) ABSTRACT

The present invention is directed to a built-in solution for soft error protection by forming an epitaxial layer with a graded dopant concentration. By grading a dopant concentration, starting from a first dopant concentration and ending with a second dopant concentration at the device layer, usually determined by the characteristics of the device to be built in the device layer, a constant electric field ($\epsilon$-field) results from the changing dopant concentration. The creation of this $\epsilon$-field influences the stray, unwanted charges (or transient charges) away from critical device components. Charges that are created in the epitaxial layer are sweep downward, toward, and sometimes into, the substrate where they are absorbed, thus unable to cause a soft error in the device. The graded layer may be formed over the substrate and at a started dopant concentration different then that in the substrate itself, thereby further influencing the character of the electric field by creating a thin, but rather intense $\epsilon$-field at the interface junction between the epitaxial layer and the substrate. A graded epitaxial layer may also be used in conjunction with a P+ substrate by interposing an intrinsic layer between the device layer and the substrate. An even higher reduction is soft error rates are with P– substrates in which a buried n-layer is formed between the substrate and the intrinsic layer. The addition of the n-layer causes a pair of additional electric fields to be created at the junction interfaces between the substrate and the intrinsic layer.

9 Claims, 25 Drawing Sheets

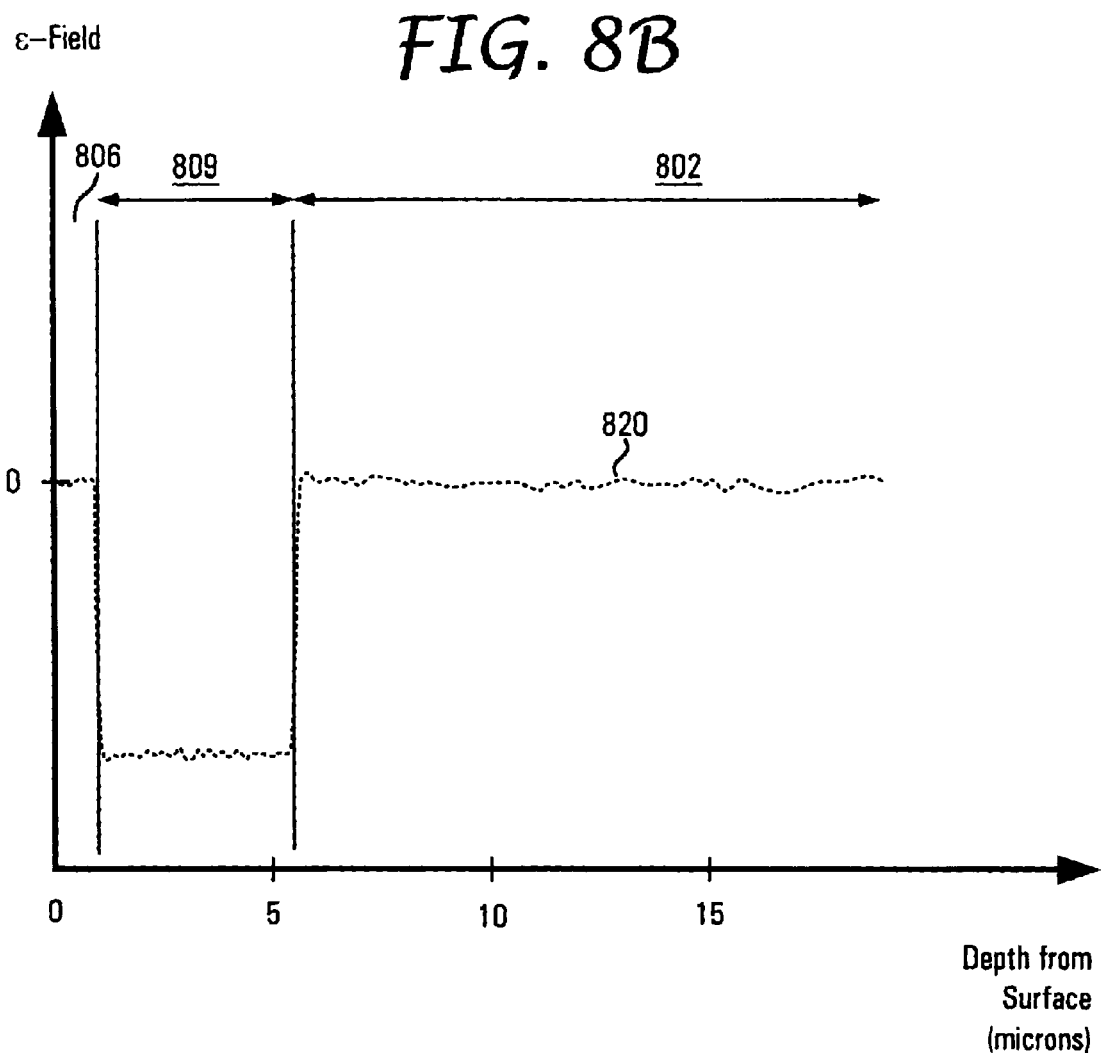

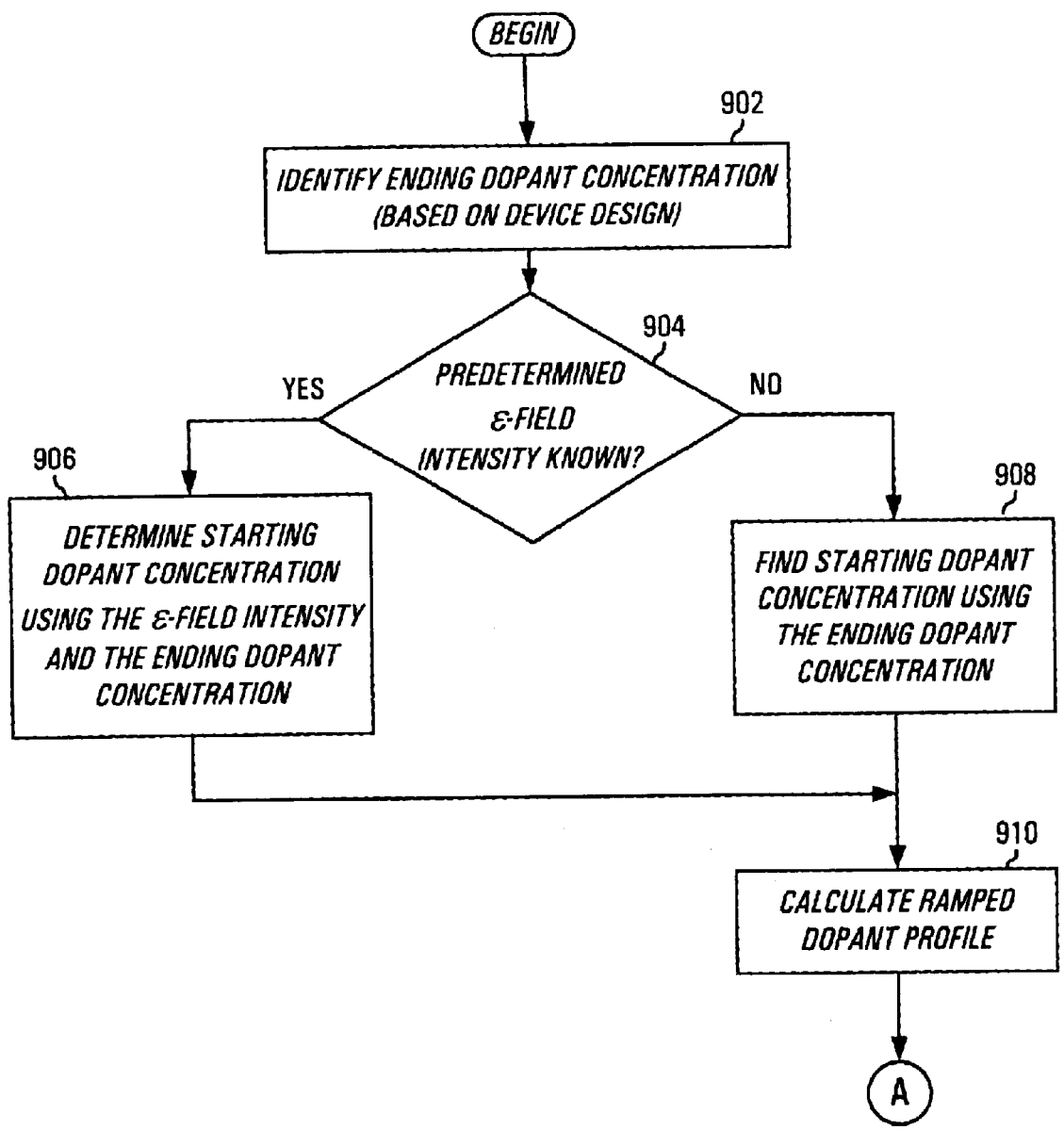

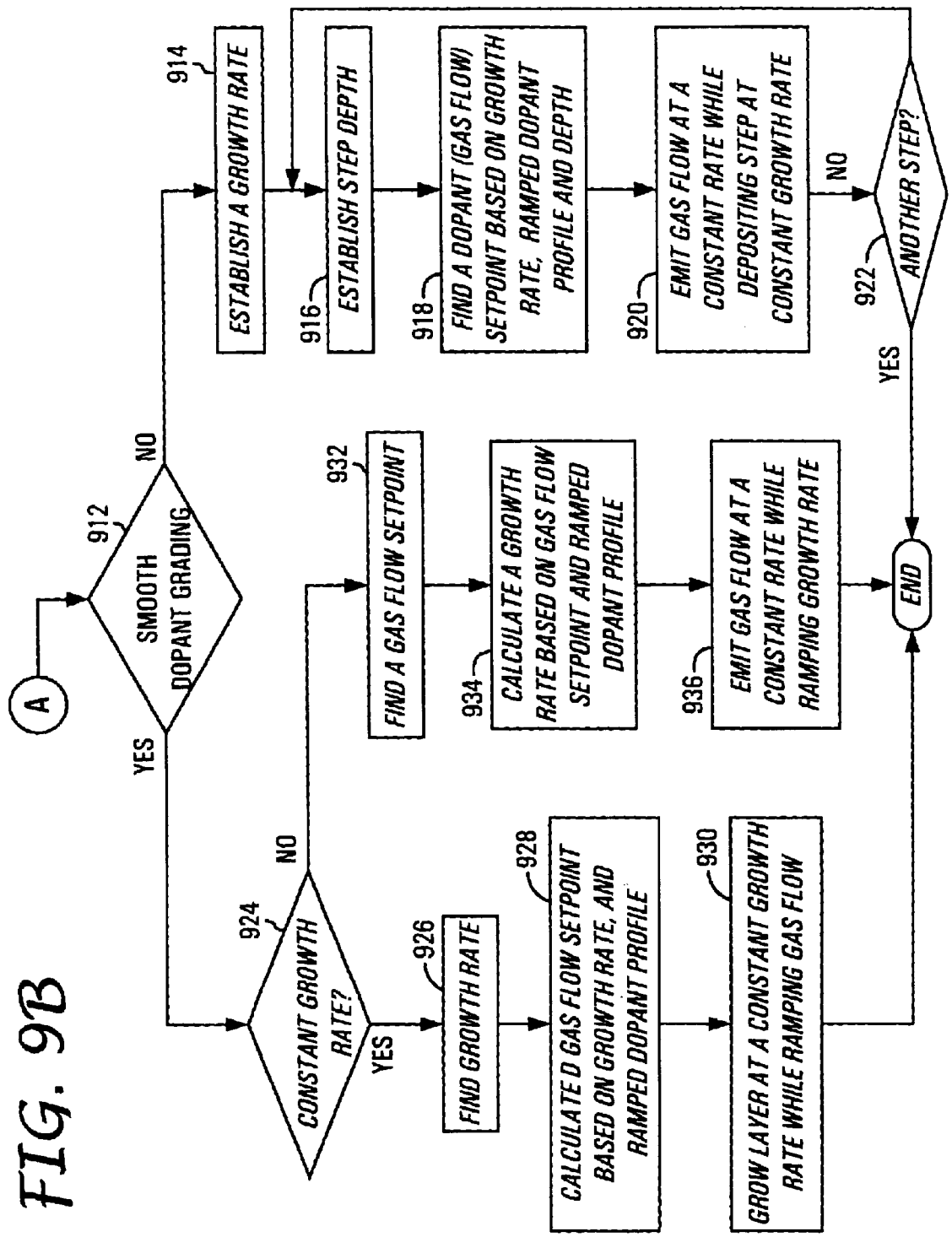

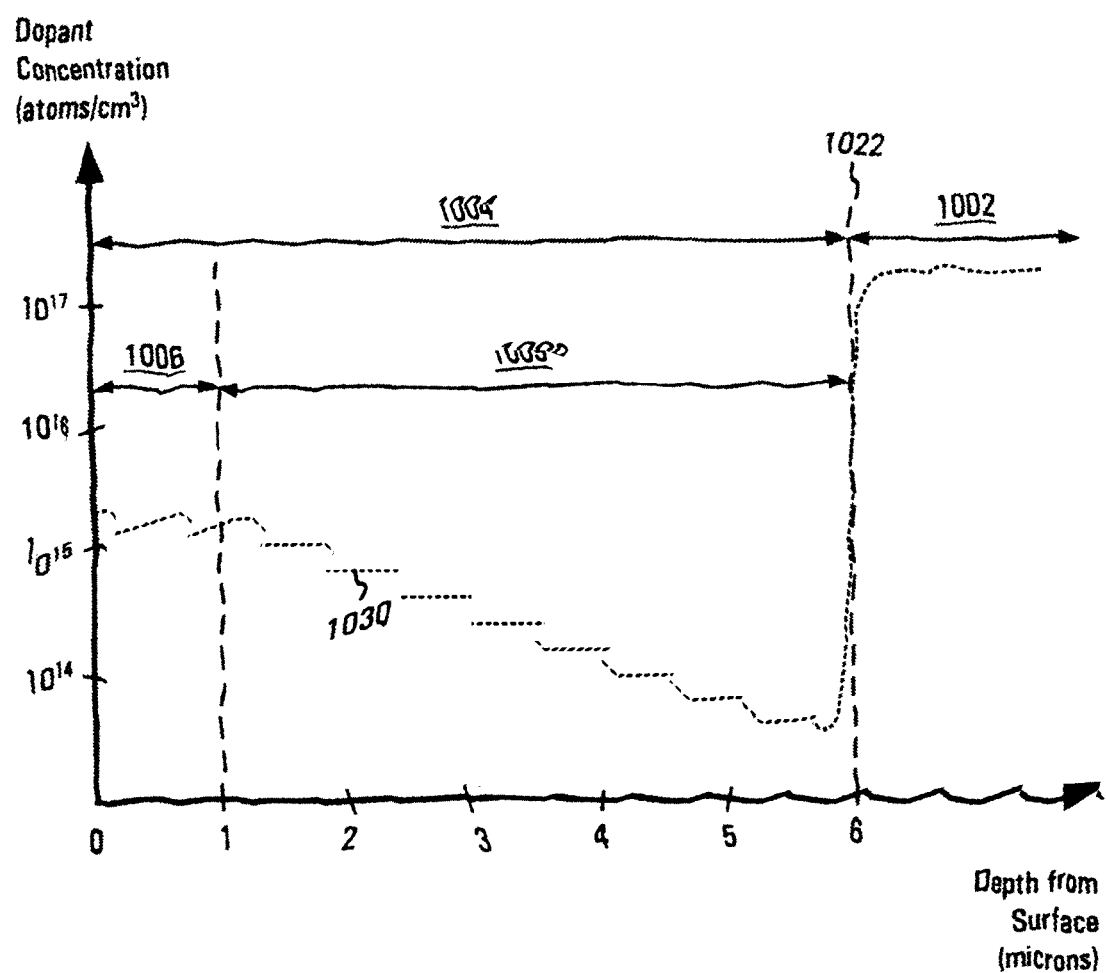

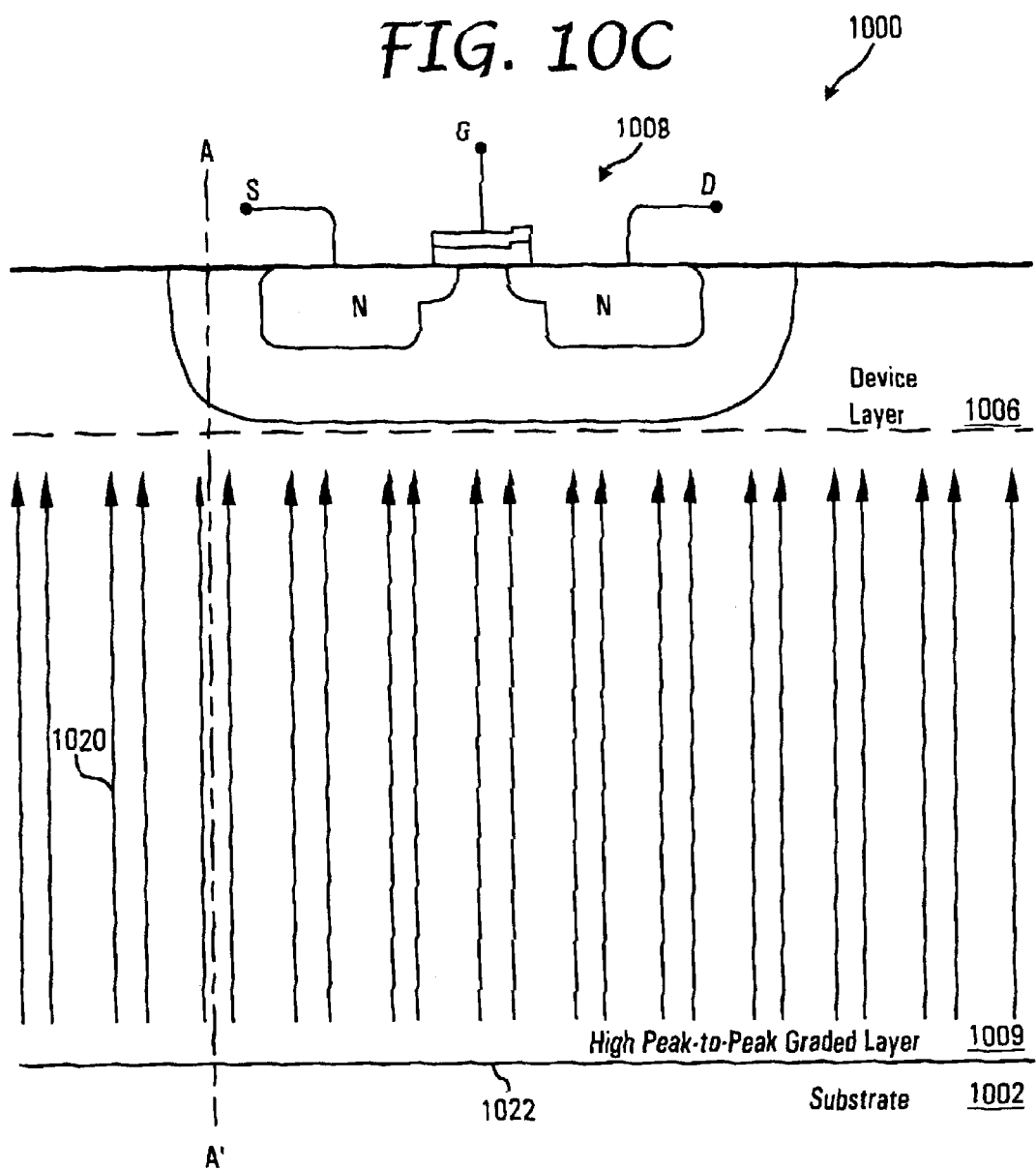

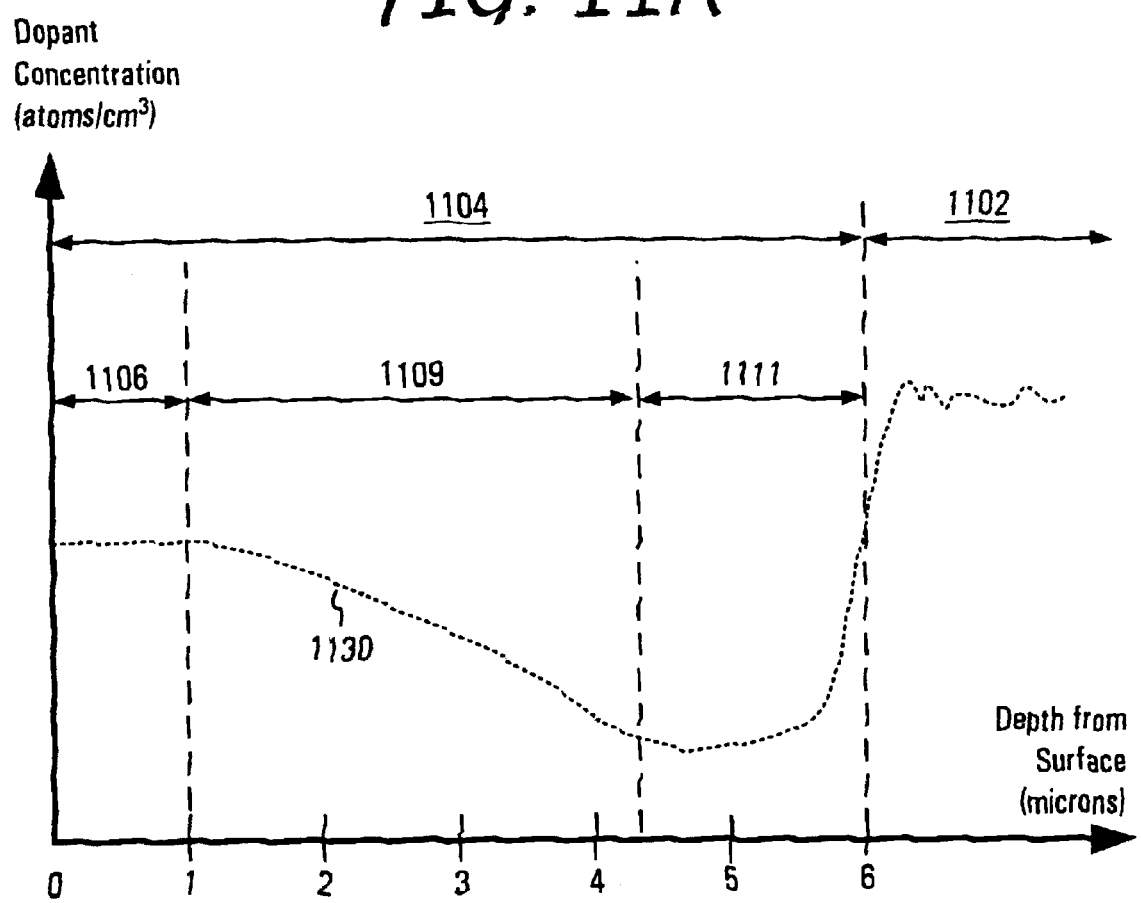

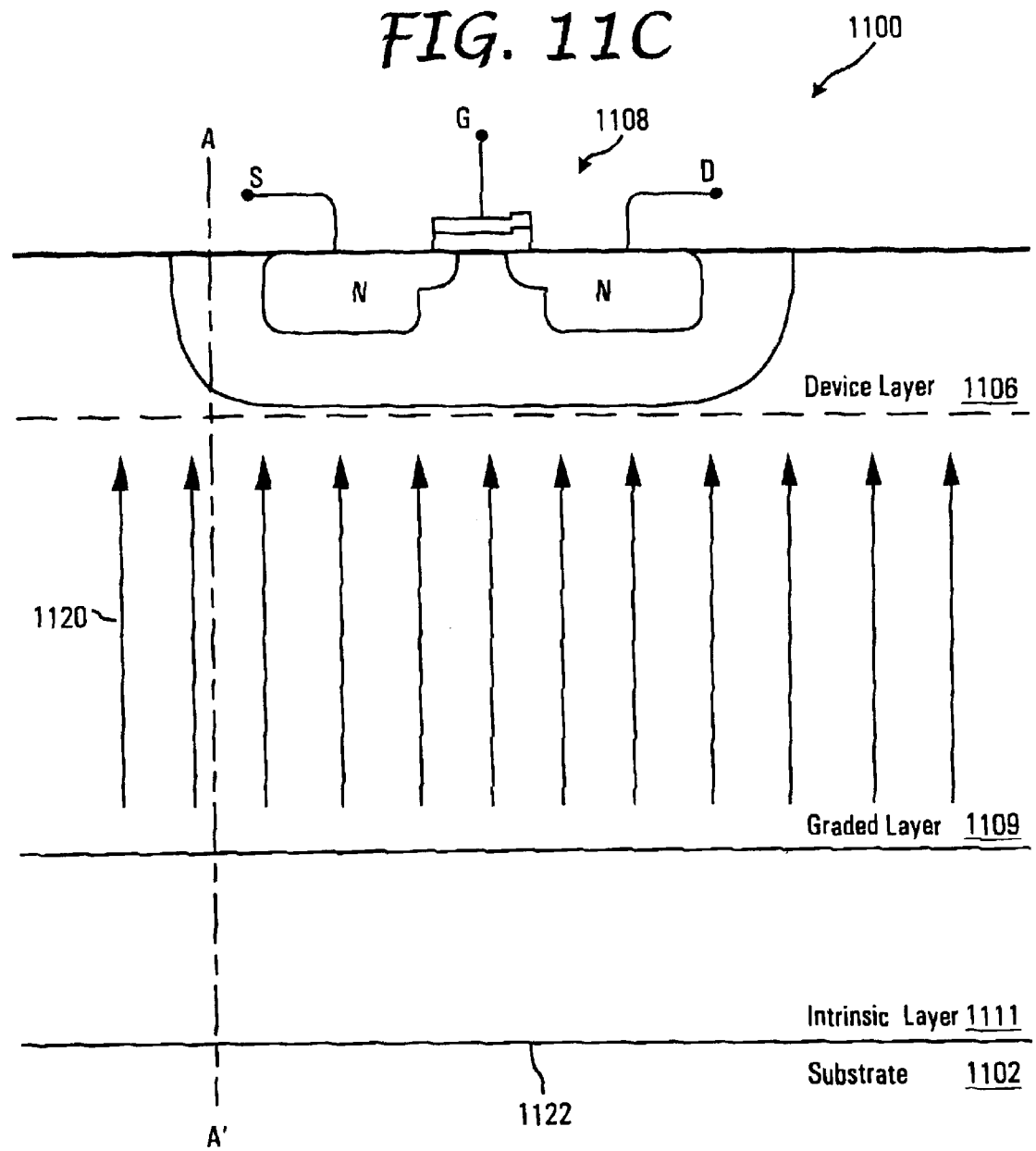

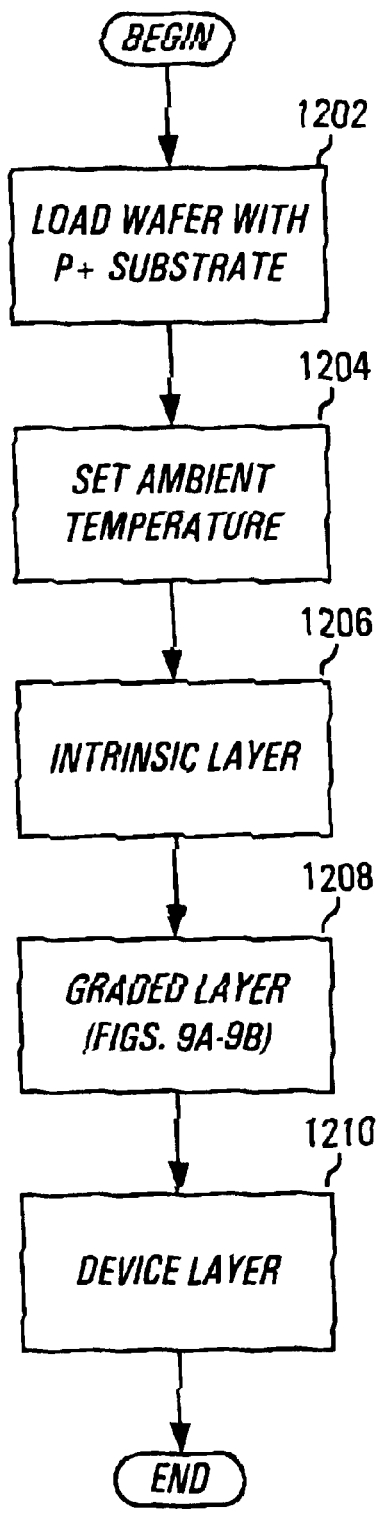

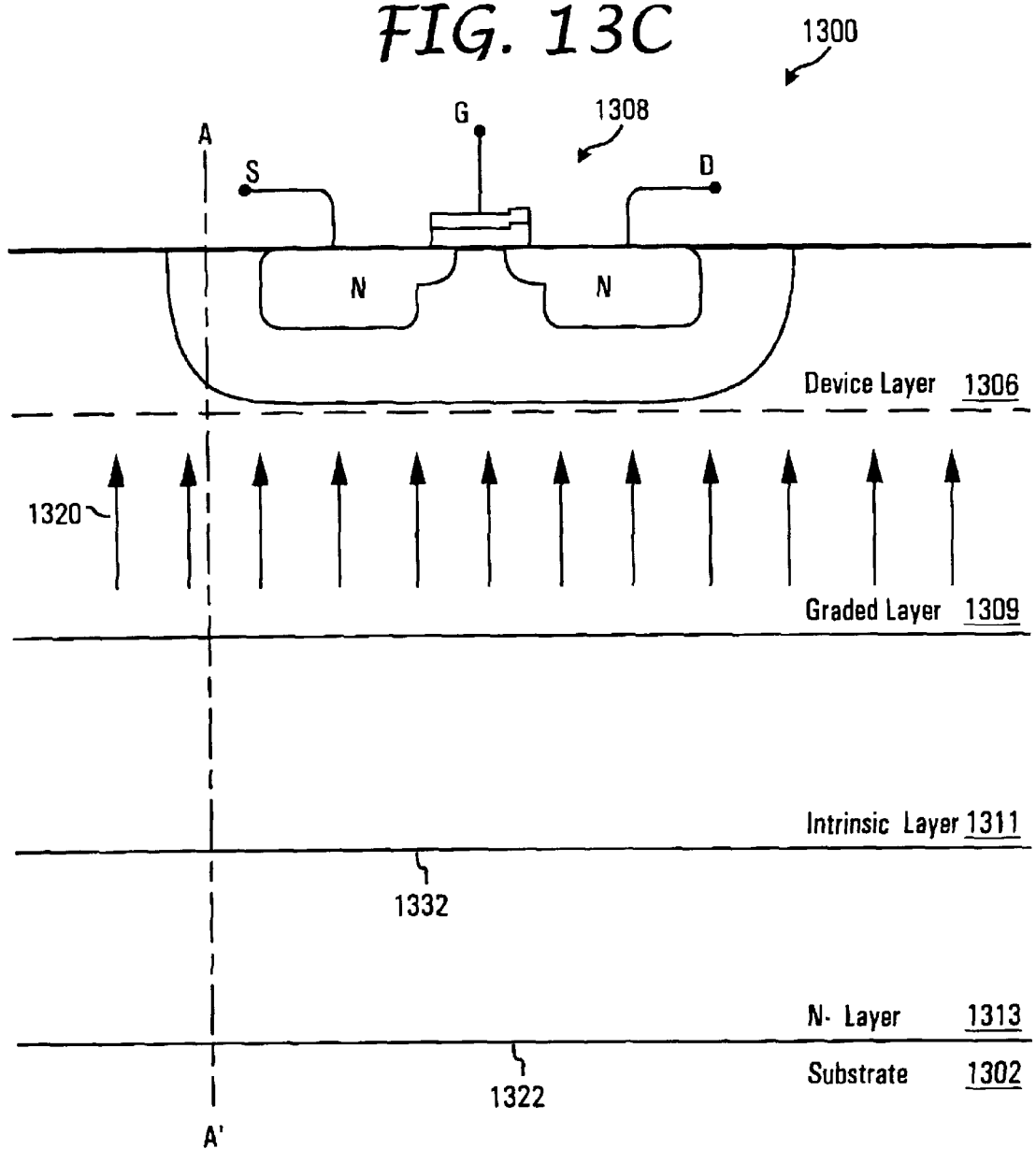

SYSTEM AND METHOD FOR REDUCING SOFT ERROR RATE UTILIZING CUSTOMIZED EPITAXIAL LAYERS

CROSS REFERENCES TO RELATED APPLICATIONS

The present application is related to and claims priority from co-pending U.S. Provisional Patent Application No. 60/411,815 entitled "System and Method For Reducing Soft Error Rate Utilizing Customized Epitaxial Layers" filed Sep. 18, 2002. Also, the present application makes reference to U.S. non-provisional patent application Ser. No. 10/244,946 entitled "Semiconductor Devices with Soft Error Protection and Systems and Methods Using the Same" filed on Sep. 17, 2002 which claims priority from U.S. provisional patent application No. 60/322,960 filed on Sep. 17, 2001.

The above-identified applications are incorporated by reference herein in their entireties.

BACKGROUND OF THE INVENTION

1. Field of the Invention

The present invention relates to semiconductor processing. More particularly, the present invention relates to fabricating epitaxial layer of a semiconductor. Still more particularly, the present invention relates to a method for processing epitaxial layers of a semiconductor for reducing soft errors and a resulting semiconductor and semiconductor wafer.

2. Description of Related Art

A "soft error" is a glitch or error in the functioning of a semiconductor device. The frequency of the occurrence of soft errors is described as the soft error rate (SER). Soft errors are particularly problematic with respect to memory devices, but many types of semiconductor devices are prone to soft error glitches. Soft errors occur randomly and are not normally catastrophic. Typically, soft errors are not due to any permanent physical defects in the memory or device, and when they occur, they do not normally damage the device.

To understand the nature of soft errors, one must recall that integrated circuits (ICs) manipulate charge in order to perform logic functions, process instructions, store data, etc. As device geometries decrease, the amount of charge used for processing and storage also decreases. A certain threshold of charge, or critical charge, must be present (or absent) for the device to recognize that the charge exists (or does not exist). If stray, unwanted charge (or transient charge) is able to add or subtract from the charge being used to perform functions or store data. It is possible that the critical charge can be converted from one logic state to another (from a high to a low, or a low to a high) without receiving or contrary to internal instruction signals. Importantly, soft errors are caused by forces outside of the designer's control.

Soft errors result when a charged particle strikes the semiconductor device, usually a memory structure or a memory-type element. Soft errors may not result from a direct hit on the device itself, but often result from the particle traversing a semiconductor in the vicinity of a device fabricated within the semiconductor. Soft errors occur when a bit (or any dynamically stored charge in a logic circuit) in a memory cell flips as a result of a charged particle penetrating (within the vicinity of) one or more of the memory cell storage locations. The charge (electron-hole pairs) generated by the interaction of an energetic charged particle with the semiconductor atoms corrupts the stored information in the memory cell. Generally, when the charged particle crosses a transistor junction, gate or adjacent arrays, an aberrant charge is created.

Charged particles can come directly from radioactive materials and cosmic rays, or indirectly as a result of high-energy particle interaction with the semiconductor itself. As high-energy cosmic rays and solar particles react with the upper atmosphere, high-energy protons and neutrons are generated and shower to the ground. Neutrons are particularly troublesome as they can penetrate most man-made construction (a neutron will easily pass through 5 feet of concrete), but it is generally accepted that alpha particles present the greater problem as they are much more prevalent than other harmful cosmic particles in the atmosphere. The concentration of high energy cosmic particles varies with both latitude and altitude. For example, London, U.K. experiences approximately four times the amount of cosmic particles than does southern Los Angeles, Calif., U.S.A. Similarly, Denver, Colo., U.S.A., which has an elevation of over 5,000 ft. above sea level, receives approximately 1.5 times the amount as does San Francisco, Calif. U.S.A. which is situated near sea level. However, soft error sources may also be terrestrial in origin. For example, one source of alpha particles is the packaging materials of integrated circuits in which trace amounts of alpha producing radioactive isotopes are present. Bump materials used in the certain Flip-Chip packaging techniques have also been recently identified as also containing alpha particle sources.

Once a soft error has occurred, the only remedy is to either write new data to the invalid memory area, if the area can be identified, or restart the system using the memory, thereby resetting all memory locations to known states. Many systems can tolerate some level of soft errors. For example, memory errors which result in missing or wrong colored bits on a display screen are rarely noticed in video applications. However, such is not the case when the affected memory elements are used to control the functionality of the device, such as in an SRAM FPGA. In those cases, soft errors can have a much more serious impact and lead not only to corrupt data, but also to a loss of functionality and system critical failures.

The SER phenomenon was first noticed in DRAMs, SRAM and SRAM-based devices are also subject to the same effects. Unlike capacitor-based DRAMs, SRAMs are constructed of cross-coupled devices which have far less capacitance in each cell. The lower the capacitance of a cell, the greater the likelihood of an upset.

Some of the fundamental aspects of the SER problem may be better understood in conjunction with the description of the device in FIG. 1. FIG. 1 is a diagram of a portion of a typical semiconductor and is not meant as a preferred description, nor is the figure intended to limit the application of the present invention in any way. FIG. 1 depicts semiconductor 100 as an impurity layer formed or grown on substrate 102 which consists of epitaxial layer 104. One of ordinary skill in the art would readily understand that epitaxial layer 104 may be grown with the demands of different applications in mind, e.g., power devices require low-doped ($10^{13}$ to $10^{15}$ cm$^{-3}$), thick (30 to 100 $\mu$m) layers whereas high-frequency devices require thin layers (<0.2 $\mu$m to several $\mu$m) with moderate ($10^{15}$ cm$^{-3}$) to heavy doping ($10^{19}$ cm$^{-3}$). As depicted in the diagram, device 108 has been fabricated in an upper layer of epitaxial layer 104 of semiconductor 100 using any well-known device fabrication process. Device layer 106 may be formed, or grown, epitaxially as described at http://www.globitech.com/epitaxy.htm. The layer in which devices are fabricated is commonly referred to as a device layer, in the depicted example, device layer 106. With regard to the specific example, device 108 is a field effect transistor (FET) which is well known to artisans in the art as consisting of three regions, labeled source S, gate G and drain D. Gate G is a sandwich consisting of the underlying material, in this case the P-epitaxial layer 104 forming P-channel 105; thin insulating layer 109 (usually silicon dioxide); and upper metal layer 107. In FIG. 1, the semiconductor material in the source and drain regions 101 and 103 are doped with N-type material which is a different type of material than in the region under the gate, thus an NPN MOSFET; however, but device 100 could be a PNP with P-type source and drain and an N-type gate.

Traversing the layers of semiconductor 100 is particle 110, in this case shown as an particle, but it could be any type of fast moving or charged particle, such as a neutron, an alpha particle or gamma ray. Notice that particle 110 does not directly contact device 108. Upon making contacting with the surface, particle 110 causes track 111 of stray charges 112 to be created consisting of electron-hole pairs of a given length and lifetime, depicted as electrons (−) and holes (+). As mentioned, particle 110 can originate from any number of sources. A particle can enter a semiconductor at almost any angle depending only on the direction of the path of the particle relative to the orientation of the semiconductor. Particle 110 is depicted in the illustration as entering the semiconductor at an incident angle with respect to the surface and incident angle is depicted as being sufficiently large such that particle 110 penetrates device layer 106, epitaxial layer 104 and substrate 102 before it is absorbed or exits semiconductor 100. It might be expected that the electrons and holes recombine almost instantly, and in fact, most do. However, some of dislodged carriers 112 often do not recombine instantaneously, but instead migrate to nodes of the opposite potential to which they are attracted. Likely targets include capacitor plates, bitlines, latching nodes, bootstrap nodes and sense nodes. This occurrence can result in a change in state ("upset") of the corresponding circuit, a soft error, especially in circuits utilizing very small capacitances transferring very small charges. One of the most significant discoveries in understanding how charged particles, such as alpha-particles, upset circuits was that charges 112 developed along particle 110's track distort local electric fields such that charges 112 are pulled back up track 110 toward the semiconductor surface rather than diffusing into the semiconductor bulk in an effect called "funneling." This greatly increases the harmful SER.

The soft error metric is failure-in-time (FIT). Often, a typical soft error rate is given as 1,000 FITs which means that one device will fail every 144 years. However, with current 0.13-micron technology, error rates of 10,000 or 100,000 FITs per megabit have been reported thus increasing the frequency of error in a single device down to weeks or months from a typical failure rate of 144 years. Additionally, and as mentioned above, the failure rate may also change depending on the latitude and altitude in which a particular device is operating. For example, the International Business Machine Corporation (IBM) has discovered that SRAM tested at 10,000 feet above sea level will record SERs that are 14 times the rate tested at sea level. Therefore, SER poses a significant problem in non-terrestrial applications such as air and spacecraft control and communications devices.

Historically, SER reduction efforts have been in three general areas: packaging; circuit design and layout; and semiconductor fabrication. Initially, it has been understood that soft errors of a terrestrial origin are much easier to prevent than those having a cosmic origin. These are due almost entirely to alpha particles. Their effect can be minimized by: 1) limiting their source of the alpha particles by using packaging materials with low uranium or thorium contaminants; 2) using coatings over the die to block the alpha particles; and finally; 3) by making the memory bit less vulnerable to particle hit. However, for particles of non-terrestrial origin resulting from cosmic rays, the primary way to limit soft errors at the chip level is by making the memory bit less vulnerable to the hit.

Alpha particles typically travel approximately 20 to 25 $\mu$m before they are stopped. This leads to the conclusion that the source of alpha particles must be relatively close to the memory bits themselves, such as the chip metalization, die coats, adhesives, package lead frames, and mold compounds. Thus, by using higher quality packaging materials, the number of potential soft error rates can be realized. In addition to selecting higher quality packaging, manufacturers often coat the chip with low emission die coats to take advantage of the limited range that alpha particles can travel before being stopped. However, these solutions add costs to the chip fabrication and do little to increase SER reduction resulting from cosmic particles.

Prior art SER reduction techniques have recognized that SER resulting cosmic particles can be virtually eliminated at a subterranean depth of 60 feet being shielded by solid rock. In certain situations, devices operated in extremely mission critical applications may be assured of extremely low SERs by operating the devices subterranean. Rarely is the subterranean operation of devices practicable, regardless of their mission. Pragmatically, mission critical devices should be operated at lower attitudes; basements offer the most practical protection, and if feasible, in locations having lower geographic latitudes.

The prior art suggests making the memory bit less vulnerable to particle hit primarily by selecting optimal circuit design and layout alternatives. One technique involves utilizing memory with increased capacitance in a storage node SER robustness. Increasing a node capacitance can exponentially reduce the probability of an SER on that node. Another is to select memory cell designs that use relatively higher voltage. The higher the charge, the better the SER resistance. The array nodes for 0.17 um trench processes are nominally 1.8 volts and are higher than that present in other technologies, which can use voltages of 1.5 volts and lower. The use of shallow wells in order to reduce the collection efficiency of a charge created by a radiating particle is another technique, as well as selecting cell designs with lower collection efficiency and smaller array size. For example, a DRAM cell has one transistor whose junctions can serve as a charge collector, while SRAM architectures will have both more and larger junctions associated with each bit of data. Increasing the signal margin (the ratio of cell capacitance to bitline capacitance), thereby resulting in higher signal-to-noise ratio into a sense amplifier. Finally, the prior art suggests that the use of error correction code (ECC) wherein one bit errors are errors are not only detected, but also corrected on the fly. For this reason, ECC is also commonly referred to as error checking and correcting and has a dramatic impact on reducing the effects of SER.

Soft errors continue to become a growing concern. The most effective defense suggested by the prior art seems to be directed to the detection of these errors and subsequent correction. This has been accomplished with on-chip circuitry that continuously performs logic tests to determine whether a logic node has been converted erroneously. Once an error is detected, this circuitry must also perform the correction. The difficulty in this approach is becoming apparent as device geometries continue to decrease. The sensitivity to transient charge due to decreased critical charge, and the increased complexity and density of leading edge IC device designs, make error detection and correction circuitry increasingly prohibitive in terms of complexity and silicon real estate.

Several "design-around" solutions for handling the stray carrier charges have been proposed in the prior art, including the formation of retrograded well structures as described in U.S. patent application Ser. No. 2002/0020888A1 filed on Feb. 21, 2002 by Yamashita et al. Yamashita describes a process for controlling soft errors based on electrons, with a retrograde well having a high doping concentration formed over a second layer with a low doping concentration which, in turn, has been formed over a substrate doped with a concentration between that of the well and the second layer. The wells are doped in a typical fashion by forming a mask of a patterning of resist for the active well region, onto another layer in which ions have been implanted. This layer may require thermal annealing. The resulting potential formed inside the well near the interface of the second layer acts as a barrier to stray charges, thereby reducing the SER. Of course, devices requiring wells of different types and concentrations are most probably handled in separate processing steps which increase processing time and cost.

Other shortcomings of the retrograded well solution for the reduction of SER will be apparent with the description of FIGS. 2–4 in which numbering is consistent throughout for designating like parts. FIGS. 2–4 are spreading resistance profiles (SRPs) which each graphically illustrates dopant concentration (atoms/cm$^3$) in the vertical axis plotted against depth from the surface of a wafer (x10$^{-6}$ (microns)) in the horizontal axis. FIG. 2 is a diagram of a SPR illustrating the profile of dopant concentrations measured over the depth of semiconductor 100. Semiconductor 100 is represented in the graph as having substrate layer 202, epitaxial layer 204 and well 213 (designated 102, 104 and 113, respectively in FIG. 1). Notice that depicted in FIG. 2 are two separate dopant profile curves; semiconductor dopant profile curve 230 and well diffusion dopant profile 232. Semiconductor dopant profile curve 230 is taken along semiconductor section of a A–A' cross-section of semiconductor 100 which traverses epitaxial layer 104, including device layer 106, and substrate 102. Well diffusion dopant profile curve 232, on the other hand, is taken along semiconductor section of a B–B' cross-section of semiconductor 100 which traverses only well 113 fabricated in device layer 106 of epitaxial layer 104 over substrate 102.

Doping semiconductor layers is typically performed with a constant dopant concentration throughout a given layer as can be realized from semiconductor dopant profile curve 230 which illustrates a constant dopant rate applied through substrate 202 and a lower, but constant, dopant rate applied across well depth 213. This is typical of many semiconductor applications and is shown separately in FIG. 7. Notice from FIG. 2 that semiconductor dopant profile curve 230 indicates an abrupt change in dopant concentration at the epitaxial/substrate boundary at an approximate depth of 6 microns. Typically, it is expected that an electrostatic field is associated with the interface as a result of the change in concentrations of dopants. The resulting electric field has been reported to provide a reduction in SER under certain circumstances. Mohan Rao describes several techniques for reducing SER by constructing semiconductor layer interfaces which may create an "aiding" electrostatic field to push minority carriers into bulk substrate in U.S. non-provisional patent application Ser. No. 10/244,946 entitled "Semiconductor Devices with Soft Error Protection and Systems and Methods Using the Same" filed on Sep. 17, 2002 and incorporated by reference herein in its entirety.

Another known technique in semiconductor manufacturing introducing dopants into the wafer surface can result in a natural graded dopant profile below the dopant diffusion well as illustrated by well diffusion dopant profile curve 232. For the purposes herein, a graded dopant profile may be produced as a result of an effective change in dopant concentration over a depth interval. Thus, rather than an abrupt change in dopant concentrations, as is present at many boundaries between semiconductor layers, a grading describes a rate dopant of change. Specifically, semiconductor 100 represented in the present figure has a dopant concentration of slightly below 10$^{15}$ atoms/cm$^3$ (e.g., approximately 0.8×10$^{15}$ atoms/cm$^3$) over non-well surface areas. Dopant concentrations remain a constant 0.8×10$^{15}$ atoms/cm$^3$ vertically in the non-well regions until the approximate depth of the epitaxial layer 204 where the dopant concentration increases until reaching an exemplary concentration of slightly below 10$^{18}$ atoms/cm$^3$ where it remains constant throughout the depth of substrate 202. In well areas of the semiconductor, dopant atoms are diffused into the well usually through high temperature, high pressure well diffusion process, represented in FIG. 2 as well diffusion curve 232. Notice that the doping profile of well 113 (FIG. 1) is higher near the surface, approximately 10$^{17}$ atoms/cm$^3$ but decreases with the depth of well 113 until no dopant is present, which defines the furthermost extent of well 113. Conventional wells are formed by implanting dopants and diffusing them to the desired depth. However, they diffuse laterally as well as vertically, which reduces packing density resulting in a dopant concentration curve with the character of well diffusion curve 232.

Applicants have discovered that a weak electrostatic field is associated with the graded dopant profile typical of many well diffusion doping processes. Moreover Applicants have applied this well diffusion dopant profile to the problem of SER to force minority carriers created by a charged particle, such as an alpha particle or gamma ray, which interacts with the semiconductor leaving a track of electron-hole pairs of a given length and lifetime.

FIG. 3 is a graph illustrating the profile of dopant concentrations over the depth of semiconductor 100 having a physical structure that is similar to that described above with regard to FIG. 2, i.e. having substrate layer 302, epitaxial layer 304 and well 313 (designated 102, 104 and 113, respectively in FIG. 1). Semiconductor dopant profile curve 330 taken along semiconductor section of a A–A' cross-section of semiconductor 100 is also similar to semiconductor dopant profile 230 from FIG. 2. The character of dopant profile 330 and well diffusion curve 332 generally corresponds to curves 230 and 232, respectively, although the absolute dopant concentrations vary slightly between the graphs. However, in contrast to the previously discussed dopant profile, well 113 is shown to have three dopant profile curves, well diffusion dopant profile curve 332, which is identical to well diffusion dopant profile curve 232, retrograde well dopant profile 334 and resultant well dopant profile 336. Here, since a high-energy implant is used to place the dopants at the desired depth without further diffusion, much less lateral spread will occur. Such high-energy implants also bury the peak of the impurity profile to a certain depth within the substrate, and the concentration of the impurity decreases as it approaches the wafer surface. Wells with such profile are called retrograde wells. Resultant well dopant profile 336 results from a dopant processes (ion implants) that specifically address soft errors. By exaggerating the dopant level and providing a peak concentration well below the wafer surface (retrograded well) forming retrograde well dopant profile 334, a larger dopant grading can be achieved over the well diffusion doping process. Moreover, when combined with well diffusion, resultant well dopant profile 336 is realized which can further assist in soft error reduction in the region below the retro-graded well.

Turning now to FIG. 4, the benefit of retrograde well implant is graphically illustrated as margin 452 which is a measure of the difference in resultant well dopant profile 436 and semiconductor dopant profile 430. Margin 452 suggests that the retrograde well implant provides a qualitative reduction in SER over non-retrograded semiconductor structures such as semiconductor dopant profile curve 430 which is taken along semiconductor section of a A–A' cross-section of semiconductor 100.

However, even though the utilization of retrograded implant for SER reduction provides some measurable benefit, it also suffers from a major drawback. First, retrograded well ion implant for SER reduction is a "design in" solution meaning that the total effect of the well retrograde on the device must be determined prior to implementing retrograde implantation as a solution. Not every device is compatible with a retrograded well and other applications may result in a low level resultant dopant profile which is only marginally useful for SER reduction. More importantly, the designer must design in the solution, thereby increasing design and fabrication expenses.

FIG. 5 graphically illustrates another shortcoming of retrograded well solution for SER. FIG. 5 is a cross-section of an IC device, similar to that depicted in FIG. 1 above, with a pair of particles passing through the semiconductor at different angles. Semiconductor 500 is depicted as being penetrated by two charged particles, particle 510A traversing semiconductor 500 at an incident angle $_A$, where $_A$ 0°, and further with particle 510B traversing semiconductor 500 at incident angle $_B$, where $_B$≠0°. Notice that only the region of high dopant concentration near the bottom of well 513, zone 538, provides any substantial protection from charged particles 512. Any protection achieved by the retrograde is limited only to the area below the well and cannot protect from stray charge migrating from the side of well 513 as illustrated by the arrows. From the depicted illustration, it can be clearly understood that any protection afforded by the region of high dopant concentration in zone 538 near the bottom of well 513 provides protection from charged particles 512 only where the path of the migrating particles would cross or intersect the area in zone 538. Charged particles 512 which have paths that avoid the area in zone 538 may still adversely affect the function of device 508. Even with the design-in expense associated with retrograde well implantation for SER reduction, the solution is flawed.

Thus, even with the prior art's attempt at design-in solutions to the soft error problem evolve, the primary defense to their adverse effects remain in the detection of these errors and subsequent correction due to the inadequate and unpredictable results of those solutions. Detect and correction solutions have been accomplished with on-chip circuitry that continuously performs logic tests to determine whether a logic node has been converted erroneously. Once an error is detected, this circuitry must also perform the correction. The difficulty in this approach is becoming apparent as device geometries continue to decrease. The sensitivity to transient charge due to decreased critical charge, and the increased complexity and density of leading edge IC device designs, make error detection and correction circuitry increasingly prohibitive in terms of complexity and silicon real estate. Moreover, the detection and correction solutions expropriate valuable chip functionality resources that could be allocated to the chip's primary mission, rather than SER reduction role. Thus, such chips are somewhat less efficient and require even more area to provide an equivalent level of mission functionality.

SUMMARY OF THE INVENTION

The present invention is directed to a built-in solution for soft error protection by forming an epitaxial layer with a graded dopant concentration. By grading a dopant concentration, starting from a first dopant concentration and ending with a second dopant concentration at the device layer, usually determined by the characteristics of the device to be built in the device layer, a constant electric field ($\epsilon$-field) results from the changing dopant concentration. The creation of this $\epsilon$-field influences the stray, unwanted charges (or transient charges) away from critical device components. Charges that are created in the epitaxial layer are sweep downward, toward, and sometimes into, the substrate where they are absorbed, thus unable to cause a soft error in the device. The graded layer may be formed over the substrate and at a started dopant concentration different then that in the substrate itself, thereby further influencing the character of the electric field by creating a thin, but rather intense $\epsilon$-field at the interface junction between the epitaxial layer and the substrate. A graded epitaxial layer may also be used in conjunction with a P+ substrate by interposing an intrinsic layer between the device layer and the substrate. An even higher reduction is soft error rates are with P-substrates in which a buried n-layer is formed between the substrate and the intrinsic layer. The addition of the n-layer causes a pair of additional electric fields to be created at the junction interfaces between the substrate and the intrinsic layer.

BRIEF DESCRIPTION OF THE DRAWINGS

The novel features believed characteristic of the present invention are set forth in the appended claims. However, the invention itself, as well as a preferred mode of use, further objectives and advantages thereof, will be best understood by reference to the following detailed description of an illustrative embodiment when read in conjunction with the accompanying drawings wherein:

FIG. 8B is a diagram of the electric field that is achieved as a result of the graded profile such as may be present in an IC device with a graded epitaxial layer depicted below in FIG. 8C in accordance with an exemplary embodiment of the present invention;

FIGS. 9A and 9B are flowcharts depicting a process for fabricating an epitaxial device layer having a constant electric field in accordance with an exemplary embodiment of the present invention;

FIG. 10A is a diagram of a SRP (or series of SRPs) of a reduced SER epitaxial wafer indicating the dopant concentrations for a substrate, graded layer and device layer in a reduced SER epitaxial wafer in accordance with an exemplary embodiment of the present invention;

FIG. 10C is a cross-section of an IC device with a graded epitaxial layer over a substrate in accordance with an exemplary embodiment of the present invention;

FIG. 11A is a diagram of a SRP (or series of SRPs) of a reduced SER epitaxial wafer indicating the dopant concentrations for a P+ substrate, intrinsic layer, graded layer and device layer in a reduced SER epitaxial wafer in accordance with an exemplary embodiment of the present invention;

FIG. 11C is a cross-section of an IC device with a graded epitaxial layer over a P− substrate in accordance with an exemplary embodiment of the present invention;

FIG. 12 is a flowchart of a process for building a reduced SER epitaxial wafer with a graded using an intrinsic layer over a P+ substrate in accordance with an exemplary embodiment of the present invention;

Other features of the present invention will be apparent from the accompanying drawings and from the following detailed description.

DETAILED DESCRIPTION OF THE INVENTION

The present invention is directed to a materials solution utilizing an epitaxial layer that will help prevent soft errors from occurring as opposed to prior art techniques for reacting after the error has occurred. The presently disclosed solution reduces the reliance on the detection and correction solution paradigm of the prior art, lessens the allocation of chip resources devoted to error detection and enables designers to produce even narrower array nodes for devices which operate at lower voltages. Sensitivity to transient charges is reduced even with devices operating at decreased critical charge levels. Finally, the presently described invention is a "built-in" solution rather than a "design-around" or "design-in" solution which affects the design of the entire doping structure of the device. Thus, device development parameters are far less demanding. Moreover, building-in SER solutions reduces design cost by eliminating the necessity for designers to consider the effect of the solution on the well and/or device designs, as well reducing re-engineering expenses. Because the utility of the present invention is primarily based on wafer manufacturing principles, by understanding the exemplary embodiments described herein with regard to the present built-in solution to the SER problem, a thorough understanding of wafer design is helpful.

Figure 6:
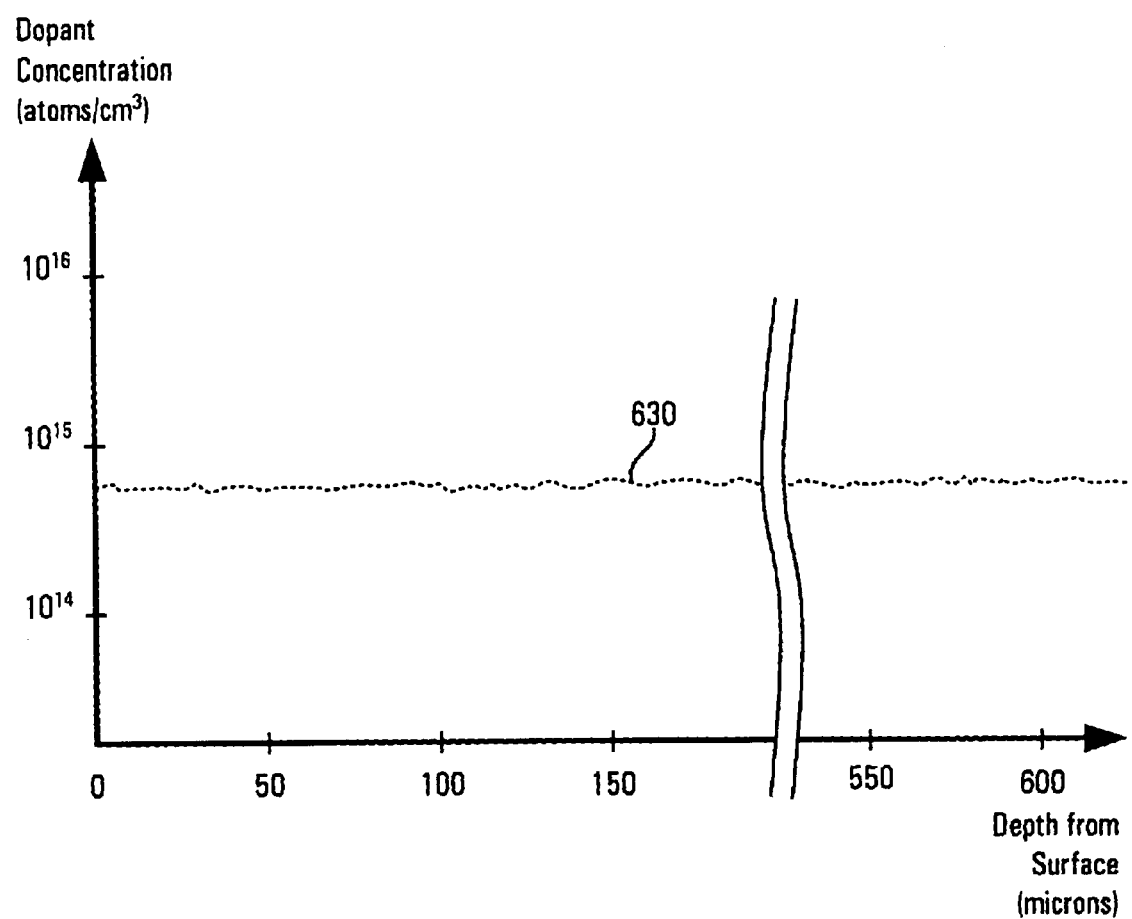
FIG. 6 is a diagram depicting a SRP of a wafer illustrating constant dopant concentration throughout the thickness of a typically doped wafer as recognized by the Applicants of the present invention.

FIG. 6 is a diagram depicting a spreading resistance profile (SRP) of a wafer illustrating constant dopant concentration throughout the thickness of the wafer as recognized by the Applicants of the present invention. As well understood by ordinarily skilled artisans in the relevant art, a wafer is a thin slice of semiconducting material, such as a silicon crystal, upon which microcircuits are constructed by diffusion and deposition of various materials. Silicon is ideal for making chips because its electric charge can easily be altered by doping the wafer or particular areas of the wafer. Many different dopants are used to achieve these desired features, e.g. Phosphorous, Arsenic, Boron and others. Doping ions are accelerated into the crystal lattice of the silicon wafer in a process commonly referred to as ion implantation.

If only selected areas of the wafer are to be doped, then the virgin areas are "masked" to prevent ions from being implanted in those areas using masking techniques which are well known in the relevant art. With reference to semiconductor dopant profile curve 630, a wafer, or portion thereof, has been doped to constant dopant concentration of approximately $0.7 \times 10^{15}$ atoms/cm$^3$ (0.07 parts per million atoms of silicon). Because the concentration of dopant is constant throughout the vertical extent of the wafer, no electric field exists therein due to the doping, and therefore the doped wafer offers no protection from the effects of SER.

As those of ordinary skill in the art would understand, "epitaxy," generally, is a method of growing single crystals in which chemical reactions produce thin layers of materials whose lattice structures are identical to that of the substrate on which they are deposited. Defects in the structure of a wafer will render integrated circuitry (IC) built thereon inoperable, so it is imperative for device operation and reliability that the silicon is ultra-pure. The circuitry may penetrate the wafer surface on the order of 2–3 microns, or more (however, the present invention is described using an exemplary device which penetrates the epitaxial layer only one micron). The overall wafer thickness is on the order of 600–700 microns, but thickness may vary depending on the application. In some cases, a thin layer of high quality silicon is epitaxially grown, or deposited, onto the wafer surface prior to device fabrication. This epitaxial layer is typically on the order of 3–10 microns, but again the thickness of the epitaxial layer may vary depending on the application beyond what is typical. The IC is then built within this epitaxial layer of pure semiconductor material as opposed to the surface of the bulk silicon wafer. The higher quality epitaxial layer has been proven to provide improvements in device performance, particularly as IC devices become smaller and more complex.

A bulk silicon wafer and an epitaxial layer both incorporate certain controlled impurities, or dopants, within the material as specified by the IC designer and manufacturer. These dopants are used as a controlled background in which the IC manufacturer will build their device. The dopant level defines the resistivity of the material, which is needed to control subsequent electrical parameters. The desired dopant concentration is typically defined to be a constant level throughout the depth of the active device region.

Figure 7A:
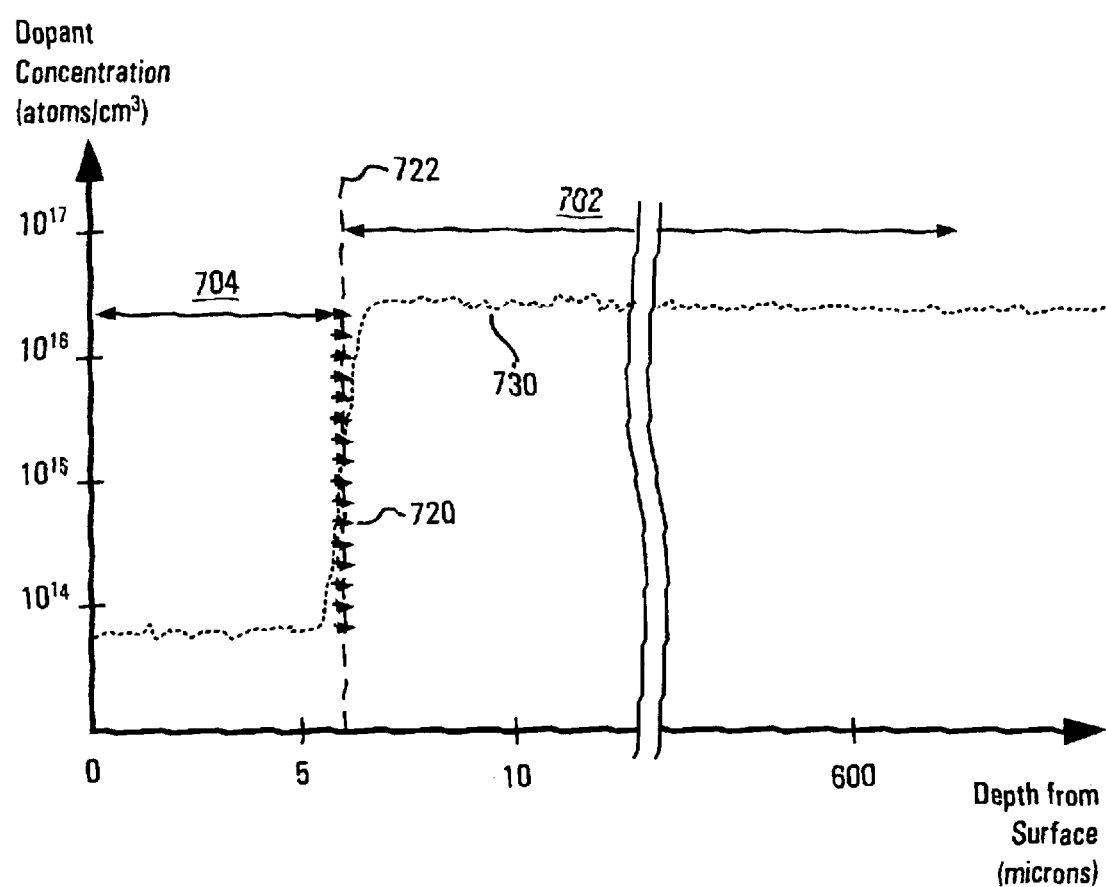
FIG. 7A is a diagram depicting the SRP of an epitaxial wafer illustrating constant dopant concentration throughout the epitaxial layer with a change in dopant concentration at the interface junction between the epitaxial layer and the substrate as recognized by the Applicants of the present invention.
Figure 7B:
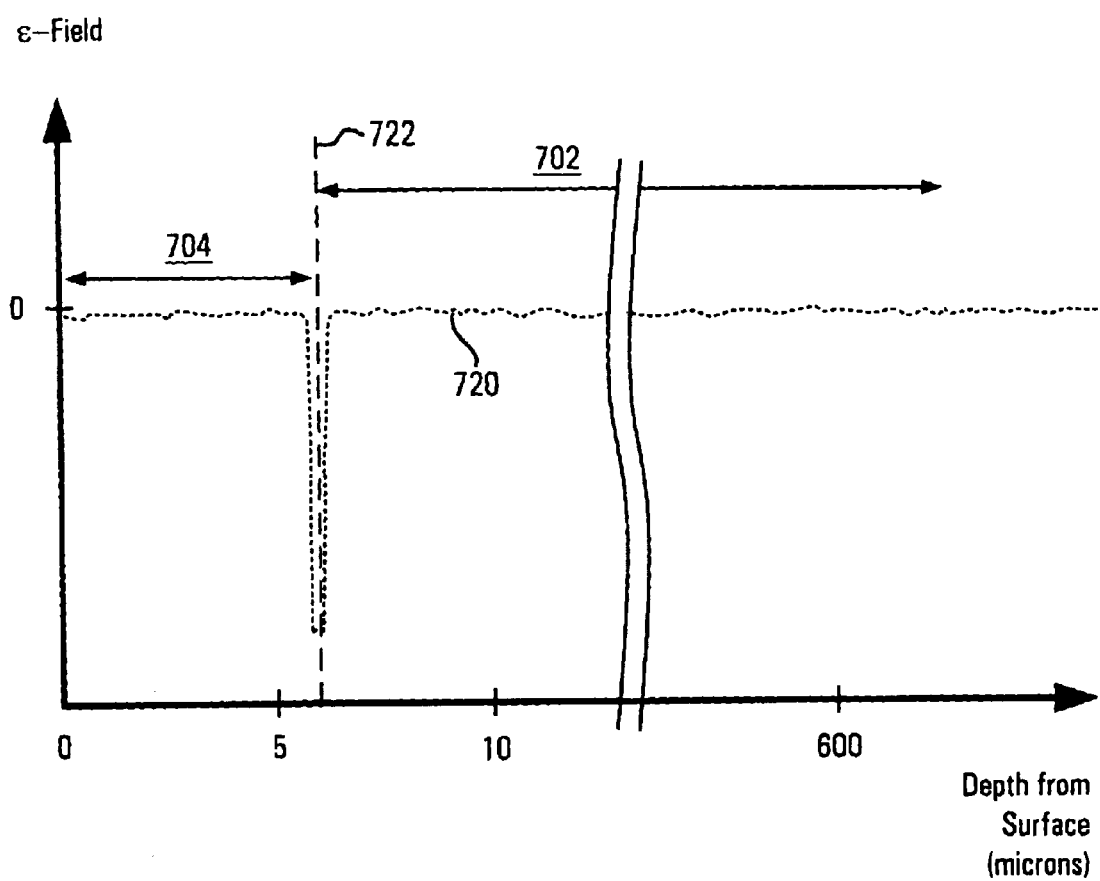
FIG. 7B is a diagram depicting an electric field associated with the interface junction formed between the epitaxial layer and the substrate depicted in FIG. 7A.

As mentioned elsewhere above, the existence of an electric field at the interface junction between two disparately doped semiconductor materials is known in the prior art. FIG. 7A is a diagram depicting a SRP of a wafer illustrating an interface junction between two dissimilarly doped materials. Depicted in FIG. 7A is two-dimensional interface junction 722 which defines the boundary between the two disparately doped semiconductor materials, such as, for example, between epitaxial layer 704 and substrate 702. FIG. 7B is a diagram depicting an electric field associated with the interface junction 722 between the two dissimilarly doped material as represented pictorially in FIG. 7A. The electric field is represented as ϵ-field 720. The horizontal extent of ϵ-field 720 continues across the two-dimensional extent of interface junction 722 and may continue across the entire two-dimensional area of the wafer. Typically, the epitaxial layer is deposited over the entire surface of a wafer as inferred from FIG. 7A using, for example, molecular beam epitaxy, liquid phase epitaxy and vapor phase epitaxy, so consequentially, interface junction 722 will continue across the entire two-dimensional area of the wafer as will the associated ϵ-field 720. However, the concept of an electric field associated with the interface junction formed between two disparately doped materials is equally applicable to applications in which interface junctions are formed as a result of selectively doping areas using a doping mask, for example, as opposed to traditional epitaxial processing with less selective doping.

At any point along interface junction 722, the vertical extent of ϵ-field 720 is extremely narrow, as interface junction 722 merely reflects a two-dimensional junction area. Consequently, ϵ-field 720 forms a two-dimensional barrier to transient charges occurring below interface junction 722, which inhibits most of those charges from migrating above interface junction 722 and into the epitaxial layer 704. Transient charges created below the interface are held back from migrating to devices fabricated in the upper layers by the force of this electric field. However, interface junction 722 provides no SER protection within epitaxial layer 704 for charged particles occurring, or migrating, past interface junction 722.

In an effort to overcome the deficiencies of the prior art attempts at SER protection, a vertical electric field is created within the epitaxial layer in accordance with one exemplary embodiment of the present invention. The SER reducing electric field of the present invention is a three-dimensional field which extends vertically across the vertical extent of the epitaxial layer, as well as horizontally across the two-dimensionally shaped interface layer. Any transient charges within the epitaxial layer, whether created from charged particles of terrestrial or cosmic origin, are influenced by field and swept down toward the substrate, away from the active device region where they cannot interfere with the performance of the device fabricated thereon. The present invention represents a truly materials solution to the SER problem by utilizing an enhanced epitaxial layer to help prevent soft errors from occurring, as opposed to reacting after the error has occurred. Consequently, the design-in aspects of the solution for well fabrication are moot, since the solution is built into the epitaxial layer.

In accordance with one exemplary embodiment of the present invention, a solution to reducing soft errors is to create a vertical electric field totally within the epitaxial layer by depositing a controlled, graded epitaxial layer. The range in the dopant level of the graded profile, and the depth over which this range is achieved, will impact the strength of the electric field. Achieving a greater peak-to-valley range of dopant will result in a stronger electric field. By gathering the stray charge in a non-volatile region of the IC, the soft error rate (SER) is greatly reduced.

Figure 8A:
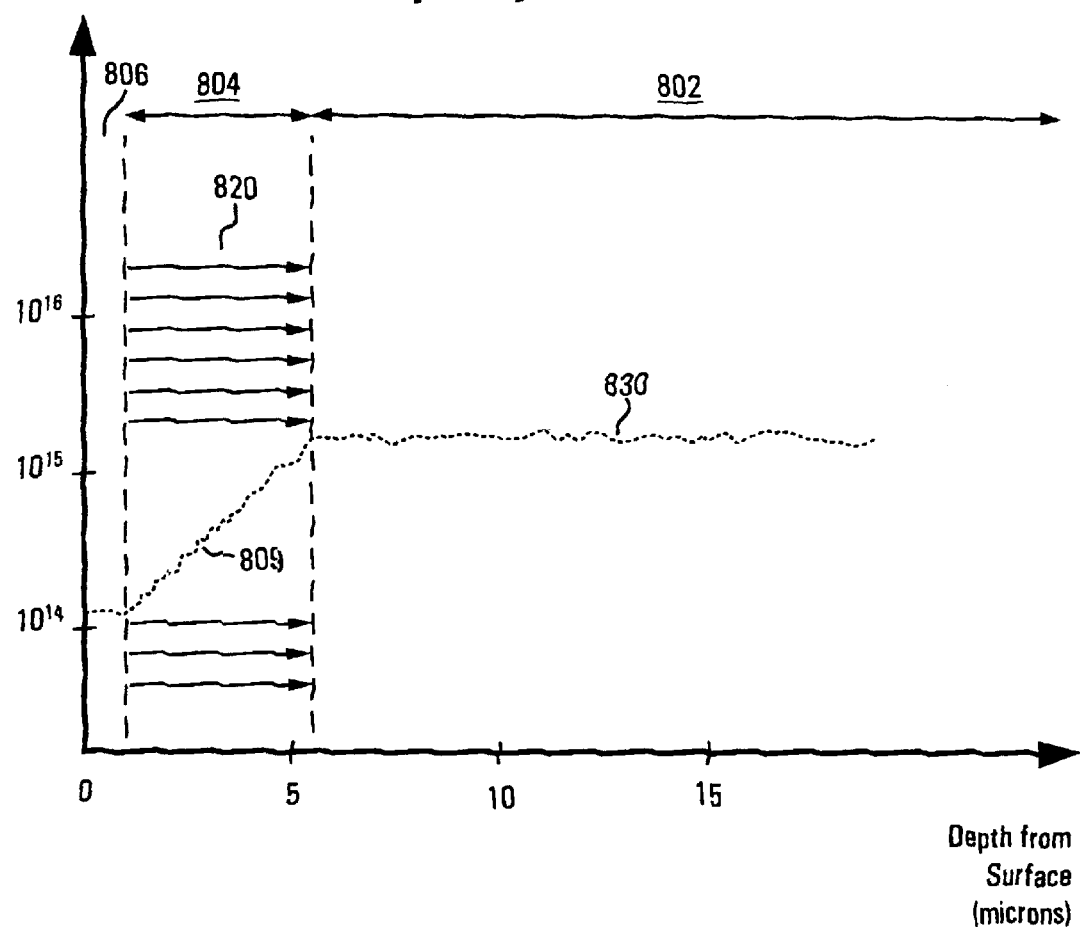
FIG. 8A is a diagram of a SRP (or series of SRPs) of a reduced SER epitaxial wafer indicating the dopant concentrations for a substrate, graded layer and device layer in a reduced SER epitaxial wafer in accordance with an exemplary embodiment of the present invention.
Figure 8C:
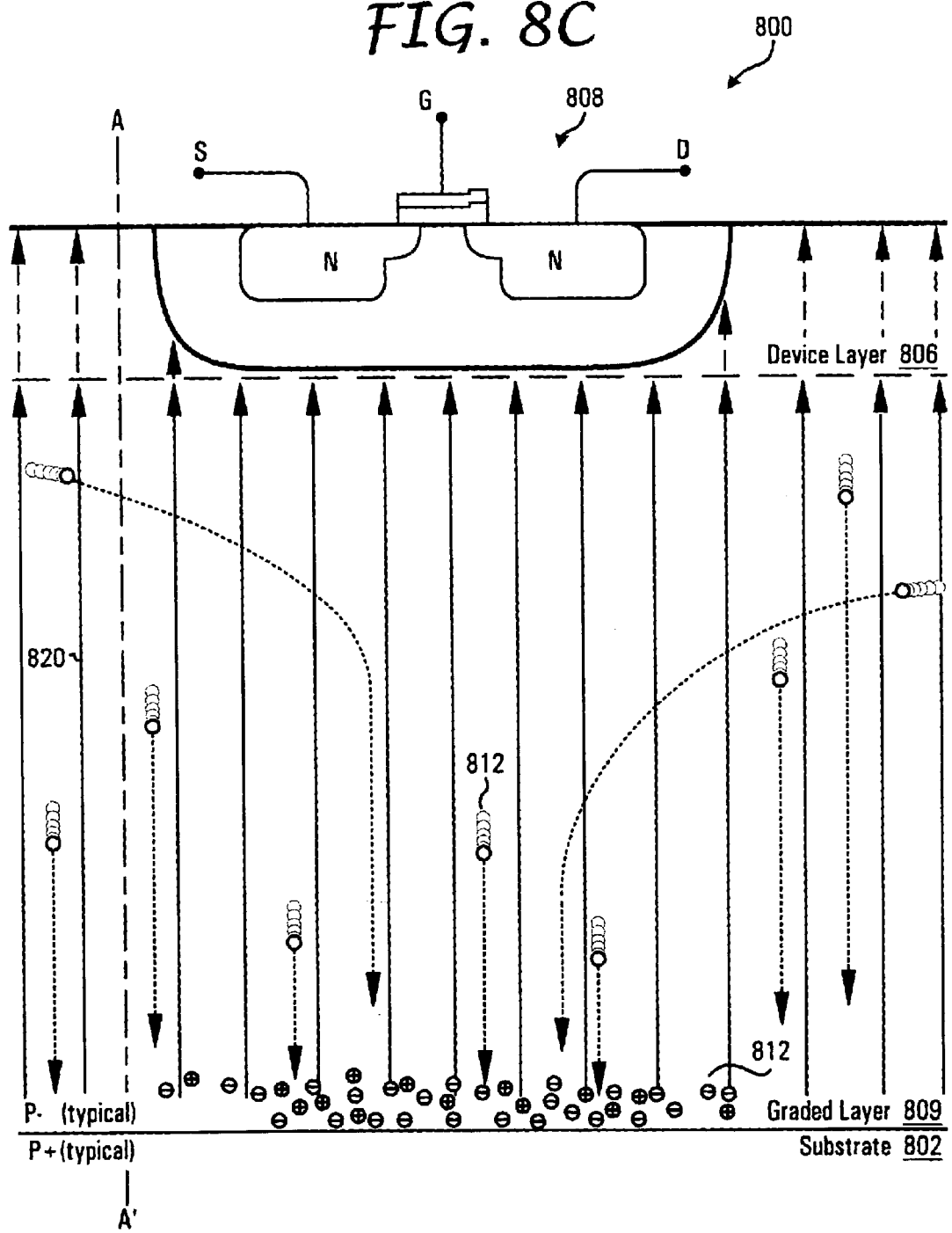
FIG. 8C is a cross-section of an IC device using a graded epitaxial layer in accordance with an exemplary embodiment of the present invention.

The solution to SER of the present invention is graphically depicted in FIGS. 8A, 8B and 8C. Turning now to FIG. 8A, a diagram depicting a SRP of a wafer illustrating a graded dopant concentration through a portion of the thickness of the wafer is shown in accordance with an exemplary embodiment of the present invention. Notice that semiconductor dopant profile curve 830 indicates a graded dopant concentration is contained within epitaxial layer 804, with constant dopant concentrations shown in both substrate 802 and device layer 806. Semiconductor dopant profile curve 830 is consistent with a wafer design in accordance with the exemplary embodiment described immediately above. ϵ-field 820 is created by, or results from, the gradual concentration changes in dopant across the vertical extent of the epitaxial layer 804. Electric field 820 traverses the vertical extent of epitaxial layer from one to six microns in depth rather than merely forming a two-dimensional surface between doped material regions. Therefore, ϵ-field 820 is significantly taller in the vertical (depth) direction than the two-dimensional, barrier-type electric fields resulting from interface junctions, as can be appreciated from the electric field profile depicted in FIG. 8B. Transient charges occurring in epitaxial layer 804 interact with ϵ-field 820 causing the charges to be swept down, away from active device region 806, toward substrate 802, regardless of where in epitaxial layer 804 the transient charges occur.

With regard to FIG. 8C, exemplary device 808 is shown on a wafer consisting of three separate layer: substrate 802, epitaxial layer 804, and device layer 806. Vertical electric field 820 is shown within the epitaxial layer and, in accordance with the present invention, influences the migration direction of transient charges 812. Vertical electric field 820 is present throughout the vertical extent of at least a portion of the epitaxial layer below device layer 806, as a result of grading the dopant profile within the epitaxial layer. Consequently, transient charges 812 which occur within (or migrate into) the volume of graded layer 809 are swept down, away from active device region 806, toward substrate 802, regardless of precisely where in graded layer 809 transient charges 912 occur or are created. By forcing stray charges 812 toward substrate 802 where they cannot interfere with the performance of device 808, transient charges 812 can then be absorbed by either epitaxial layer 804 or substrate 802. Electric field 920 may exist totally within graded layer 809 of the epitaxial layer and not extend into device layer 806 (depicted in the figure as solid arrows).

Nonetheless, in accordance with other exemplary embodiments of the present invention electric field 820 may extend into device layer 806 (depicted in the figure as dashed arrows), or in accordance with still other exemplary embodiments of the present invention, device 808 may be fabricated entirely within the graded portion of the epitaxial layer, and thus device layer 806 may be defined as a portion of graded layer 809, i.e. the graded portion of the epitaxial layer. Those of ordinary skill in the art will readily understand that a device layer is often merely an extension of, or additional epitaxial layer, comprising materials or electrical properties favorable for the fabrication of a particular class of device. Often the device layer is comprised of a different type of semiconducting material than the epitaxial layer, or the same type of semiconducting material as the epitaxial layer, but having different properties, e.g. dopant concentration, crystalline structure, internal strain, etc. In certain situations, the interface junction between the epitaxial layer and device layer may be designed such that a two-dimensional electric field exists which further inhibits the migration of the transient charges into the device layer, similar to interface junction 722 described above with regard to FIGS. 7A and 7B. Alternatively, the device layer may be defined merely as a level of dopant concentration, rather than by an interface between two disparately doped materials. The depth device layer is then determined at the depth where the dopant concentration is a predetermined level. In accordance with a first exemplary embodiment of the present invention, a dopant concentration throughout the device layer may be a constant amount, with the dopant in the epitaxial layer being a graded dopant concentration rate with the final concentration being that of the device layer. In that case, an electric field would be present in the epitaxial layer, as described above, but would not be present in the device layer. Moreover, because the interface between the device layer and the epitaxial layer is not formed by a junction between two materials with disparate dopant concentrations, there will be no electric field associated with the interface. Alternatively, and in accordance with a second exemplary embodiment of the present invention, the dopant concentrations of both the device and epitaxial layers may be graded at an identical grading rate. In that case, the depth of the device layer is defined merely by the dopant concentration and the electric field is present through the device and epitaxial layers, providing SER reduction in both. Finally, in accordance with a third exemplary embodiment of the present invention, the dopant concentrations of both the device and epitaxial layers may be graded, but at different grading rates, with electric fields being present through the device and epitaxial layers, but have differing intensities due to differences in dopant rates.

The most commonly used apparatus for controlling gas flow in semiconductor equipment is a mass flow controller (MFC) and is commercially available from a number of manufacturers. The particular piece of semiconductor process equipment, in this case an epitaxial reactor, communicates electronically with the MFC to provide a setpoint that corresponds to a particular gas flow rate. For typical epitaxial layers, the setpoint provided by the reactor to the dopant MFC is constant value throughout the deposition step, resulting in a constant dopant concentration (and therefore no electric field) within the epitaxial layer.

In order to provide a graded dopant profile throughout the epitaxial layer, a number of methods can be used. The graded layer step can be comprised of several consecutive small steps, each with a slight increase in dopant setpoint, resulting in a ramped dopant profile. The other method is to utilize a "ramping program" that is available on at least one model of epitaxial reactor. This program allows the signal to the MFC to be ramped at a given rate, resulting in a more smooth grade of dopant flow. This type of ramping program has been utilized for ramping gas flows for other applications, such as graded germanium incorporation. Still another method that can be used to produce a graded dopant profile is to ramp the epitaxial layer growth rate, i.e., ramp the flow and/or concentration of the silicon source gas). In this case, at a given dopant flow rate, less dopant is incorporated into a growing epitaxial layer with a high growth rate and more dopant is incorporated at a lower growth rate.

The presently described dopant grading process is intended to produce a resultant semiconductor dopant profile similar to that portion depicted by curve 830 of FIG. 8A above associated with the epitaxial layer, i.e., the graded dopant concentration portion of the curve. The dopant concentration of the device layer may be separately considered i.e., either a constant dopant concentration or a graded dopant concentration). Three independent graded doping processes are disclosed with various alternative methods for calculating a ramped dopant profile. The ramped dopant profile is simply a doping algorithm which is used to control the doping in, for example, an epitaxial reactor, or the like. The ramped dopant profile may be incorporated in the reactor's control software or may merely be used as a reference for manually adjusting a dopant control setting on the reactor.

It should be understood that the vertical ϵ-field in the epitaxial layer results directly from the graded dopant layer. The intensity of the ϵ-field is established by the rate of change in the graded dopant concentration, i.e., the greater the rate of change (dopant concentration/interval thickness), the steeper ramped dopant profile and the greater the intensity of the ϵ-field. Thus, the intensity of the ϵ-field $E_{gl}$ is related to the rate of change in the graded dopant concentration, $\Delta N_{gl}$, as shown below in Equation 1.

$$\Delta N_{gl} \propto E_{gl} \tag{1}$$

In other words, the rate of change in the dopant concentration is found from the ratio of difference in dopant concentration between the starting and ending dopant concentrations, and the grading layer thickness found between the starting dopant layer and the ending dopant layer, assuming a linear ramped dopant profile. As a practical matter, increasing the rate of change of the dopant concentration may be accomplished by either increasing the difference in dopant concentration between the starting and ending dopant concentrations, or decreasing the thickness of the grading layer. Conversely, a lower rate of change in the dopant concentration yields a flatter ramped dopant profile and a correspondingly lower intensity of the ϵ-field. While a relationship exists between the rate of change in dopant concentration and the intensity of the ϵ-field, those of ordinary skill in the art will readily understand that determining the absolute intensity value of a graded layer depends on other factors, such as the type of material in the graded layer, the dopant type, and even influence, to a lesser extent, other factors such as the amount of mechanical strain in the graded layer.

Neither the presence of the vertical ϵ-field nor its intensity is predicated on an absolute value of dopant concentration. The dopant concentration at any depth in a graded layer may be set at any practical level, while still achieving a vertical ϵ-field for reducing SER. Thus, the presently described method for fabricating a graded dopant layer for SER reduction is flexible enough to accommodate a wide variety of the device application types and their complementary device layer. In accordance with another exemplary embodiment of the present invention, some parametric variables relating to the intensity of vertical ϵ-field ($E_{gl}$), graded layer thickness ($t_{gl}$), starting dopant concentration ($N_{xs}$) and ending dopant concentration ($N_{xe}$) may be defined as independent variables, while others as dependent variable.

$$\Delta N_{gl} = \frac{|N_{xs} - N_{xe}|}{t_{gl}} \quad (2)$$

Since $$t_{gl} = |x_s - x_e| \quad (3)$$

$$\Delta N_{gl} = \frac{|N_{xs} - N_{xe}|}{|x_s - x_e|} \quad (4)$$

Thus, it is apparent from the foregoing that the dopant concentration of the graded layer may start or end at virtually any dopant concentration and still achieve desired ϵ-field intensity.

FIGS. 9A and 9B are flowcharts depicting a process for fabricating a graded dopant layer on a wafer in accordance with exemplary embodiments of the present invention. The process begins by identifying an ending dopant concentration for the epitaxial layer (step 902). As alluded to generally above, the ending dopant concentration is usually specified by the IC designer based on criteria for a particular device fabrication application. Other considerations necessary for accurately determining a dopant rate include parameters relating to depth, such as thickness of the epitaxial layer, thickness of the device layer, or whether or not the grading will span the device layer.

The ramped dopant profile can be calculated in one or both of two ways. If the ϵ-field intensity is known (step 904), then the starting dopant concentration can be easily calculated from the ϵ-field and the ending dopant concentration based on the depth interval that the grading is to span (step 906). The starting and/or ending dopant concentration must be specified in order to bias the ramped dopant profile. In other words, the character of the ramped dopant profile for a material can be determined merely by analyzing the ϵ-field because the electric field results from the change or grade of the dopant concentration, and not the absolute level of the dopant concentration. Thus, the character of the ϵ-field is not dependent on the absolute values of the starting and ending dopant concentrations, but on the dopant grading rate.

Once the ϵ-field intensity, ending dopant concentration and grading thickness are known, the starting dopant concentration can be calculated (step 906). A ramped dopant profile can then be calculated from the starting and ending dopant concentrations and grading interval (step 910).

Returning to step 904, if the ϵ-field intensity is not known, then a ramped dopant profile can then be calculated by finding or specifying a starting dopant concentration (step 908) and the ramped dopant profile calculated as described above (step 910). In this case, the ϵ-field intensity is subject to the difference between the starting and ending dopant concentrations over the vertical interval between the two, i.e., the dopant grading rate.

The graded dopant layer can then be grown on the wafer using the ramped dopant profile. As a practical matter, the graded layer can be grown by one of three processes; first is the effective grading or stair-step method where a series of increasing (or decreasing) dopant concentration small layers are grown, each having a constant dopant concentration. The cumulative effect is that one of the small layers is an effective graded dopant profile. The other two methods result in a true or smooth dopant grading. One involves holding the rate of layer growth constant and varying the dopant concentration, and the other by holding the rate of dopant concentration constant and varying the rate of layer growth.

Turning now to FIG. 9B, a determination is made as to whether or not a smooth dopant profile is desired, i.e., should the dopant concentration be changed at a constant rate or stair-stepped (step 912). From the grading selection block 912, to form a stair-step or effective dopant grading, a growth rate must be established which would probably be used for growing all of the individual steps (step 914). Next, the step size, or depth interval, is specified (step 916). Next, a dopant (or gas flow) setpoint is calculated for applying the ionization gas. The setpoint is determined from the ramped dopant profile and the depth of the step being grown (step 918). Since the absolute dopant concentration at any depth along the ramped dopant profile is determined from the starting dopant concentration, plus the product of the depth and the ratio of the dopant grading rate and the layer growth rate, the setpoint must be incrementally adjusted at each step depth to match the ramped dopant profile. Generally, the setpoint will change incrementally at each step from the setpoint associated with the preceding step, but there may be cases where it is desirable to hold the setpoint constant over two or more steps. A step can then be grown at the predetermined growth rate in gas flow setpoint (step 920). A check is then made to determine if it is necessary to grow another step (step 922); if so, the process reverts to step 916 and continues; otherwise, the process ends.

Returning now to the grading selection block 912, if a smooth dopant grading is selected, it can be achieved by varying the gas flow rate or the growth rate. A determination is then made whether to hold the growth rate constant while varying the setpoint, or, conversely, to hold the setpoint constant while varying the growth rate (step 924). If the variable growth rate method option is selected, the gas flow setpoint is first specified (step 932). Then the Δ (change)

growth rate is calculated from the setpoint and the ramped dopant profile (step 934). Finally, the layer is grown by emitting the gas flow at the setpoint rate and ramping the growth rate according to Δ growth rate (step 936).

Returning again to the grading selection block 924, if a smooth dopant grading is selected with a constant growth rate, the growth rate is specified (step 926). Next, the Δ gas flow setpoint is derived from the growth rate and the ramped dopant profile (step 928). Finally, the layer is grown at the specified constant rate and ramping the gas flow according to Δ gas flow setpoint (step 930). The process then ends.

Additional reductions in SER may be achieved by increasing the peak-to-valley range of dopant. By optimizing the dopant concentration of the grade region for higher peak-to-valley ranges, the resulting stronger electric fields offer proportionally more SER protection for the active region than wafers with lower peak-to-valley dopant ranges. Even more SER protection may be attained by combining SER reduction techniques, such as by providing an graded layer over an interface junction of two dissimilarly doped regions.

Figure 10B:
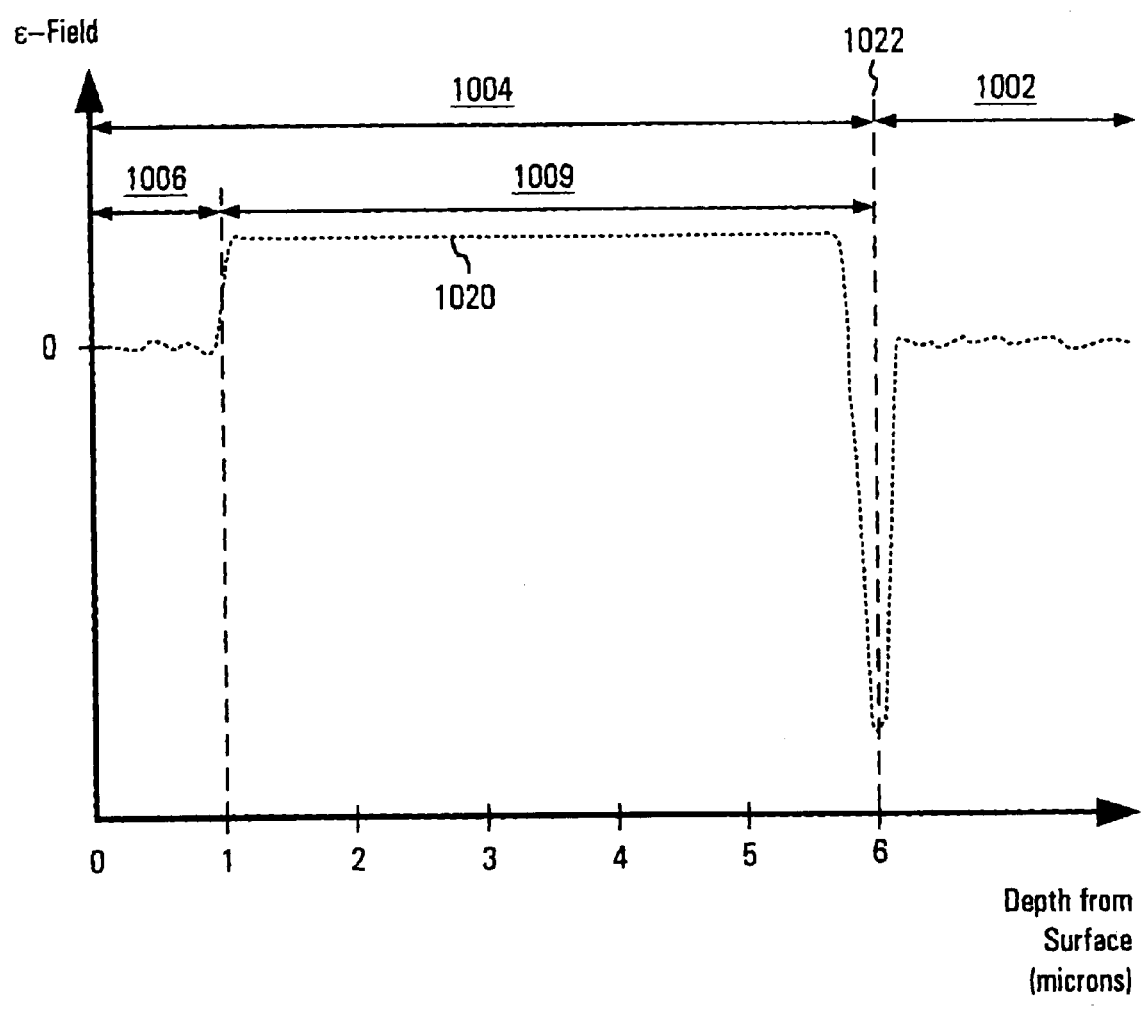
FIG. 10B is a diagram of the electric field that is achieved as a result of the graded profile such as may be present in an IC device with a graded epitaxial layer over a substrate depicted below in FIG. 10C in accordance with an exemplary embodiment of the present invention.

One optimized solution presented herein for reducing SER in accordance with an exemplary embodiment of the present invention is graphically depicted in FIGS. 10A, 10B and 10C. FIG. 10A is a diagram of a SRP (or series of SRPs) of a reduced SER epitaxial wafer indicating the dopant concentrations for a substrate, graded layer and device layer in a reduced SER epitaxial wafer in accordance with an exemplary embodiment of the present invention. From the present SRP diagram, semiconductor dopant profile curve 1030 indicates a high constant dopant concentration throughout substrate 1002. Epitaxial layer 1004 is formed over substrate 1002 having a much lower starting dopant concentration than that within the substrate (e.g., $7 \times 10^{13}$ atoms/cm$^3$ as compared to approximately $10^{17}$ atoms/cm$^3$ in the substrate), thereby creating interface junction 1022. Turning to FIG. 10B, as can be appreciated from the diagram of the ε-field intensity, ε-field 1020 shows a significant electric field is created at interface junction 1022 resulting from the lower concentration of dopant in the lower portion of graded layer 1009 interfacing with the higher dopant concentration in substrate 1002. As mentioned above, the intensity of the ε-field at interface junction 1022 is proportionate to the difference in dopant concentration in the adjoining layer.

Lowering the dopant concentration adjacent to substrate 1002 also increases the potential peak-to-valley range of dopant concentration in graded layer 1009, and the intensity of corresponding ε-field associated with that layer. As described above, often the ending dopant concentration of the graded layer is determined by the concentration in the device layer formed thereon. Since the ending concentration of the graded layer is fixed, the remaining variable for increasing the peak-to-valley range of dopant concentration is the starting dopant concentration.

FIG. 10B is a diagram of the electric field that is achieved as a result of the graded profile such as may be present in an IC device with a graded epitaxial layer over a device/substrate depicted below in FIG. 10C, and as in accordance with an exemplary embodiment of the present invention. By adjusting the starting dopant concentration lower, not only is the intensity of the ε-field associated interface junction 1020 increased, but electric field 1020 traverses nearly the entire vertical extent of epitaxial layer 1004, at least from one to six microns in depth rather than merely forming a two-dimensional surface between doped material regions. However, the graded dopant concentration is contained totally within epitaxial layer 1004, and which may or may not continue on into device layer 1006. Semiconductor dopant profile curve 1030 is consistent with a wafer design in accordance with the exemplary embodiment described immediately above. ε-field 1020 is created by, or results from, the gradual concentration changes in dopant across the vertical extent of epitaxial layer 1004. Therefore, ε-field 1020 is significantly taller in the vertical (depth) direction than the two-dimensional, barrier-type electric fields resulting from interface junctions, as can be appreciated from the electric field profile depicted in FIG. 8B. Transient charges occurring in epitaxial layer 1004 interact with ε-field 1020 causing the charges to be swept down, away from active device region 1006, toward substrate 1002, regardless of where in epitaxial layer 1004 the transient charges occur.

FIG. 10C is a cross-section of an IC device with a graded epitaxial layer for reducing SER over a substrate in accordance with an exemplary embodiment of the present invention in which the ε-field 1020 is graphically depicted throughout the vertical extent of epitaxial layer 1004.

Figure 11B:
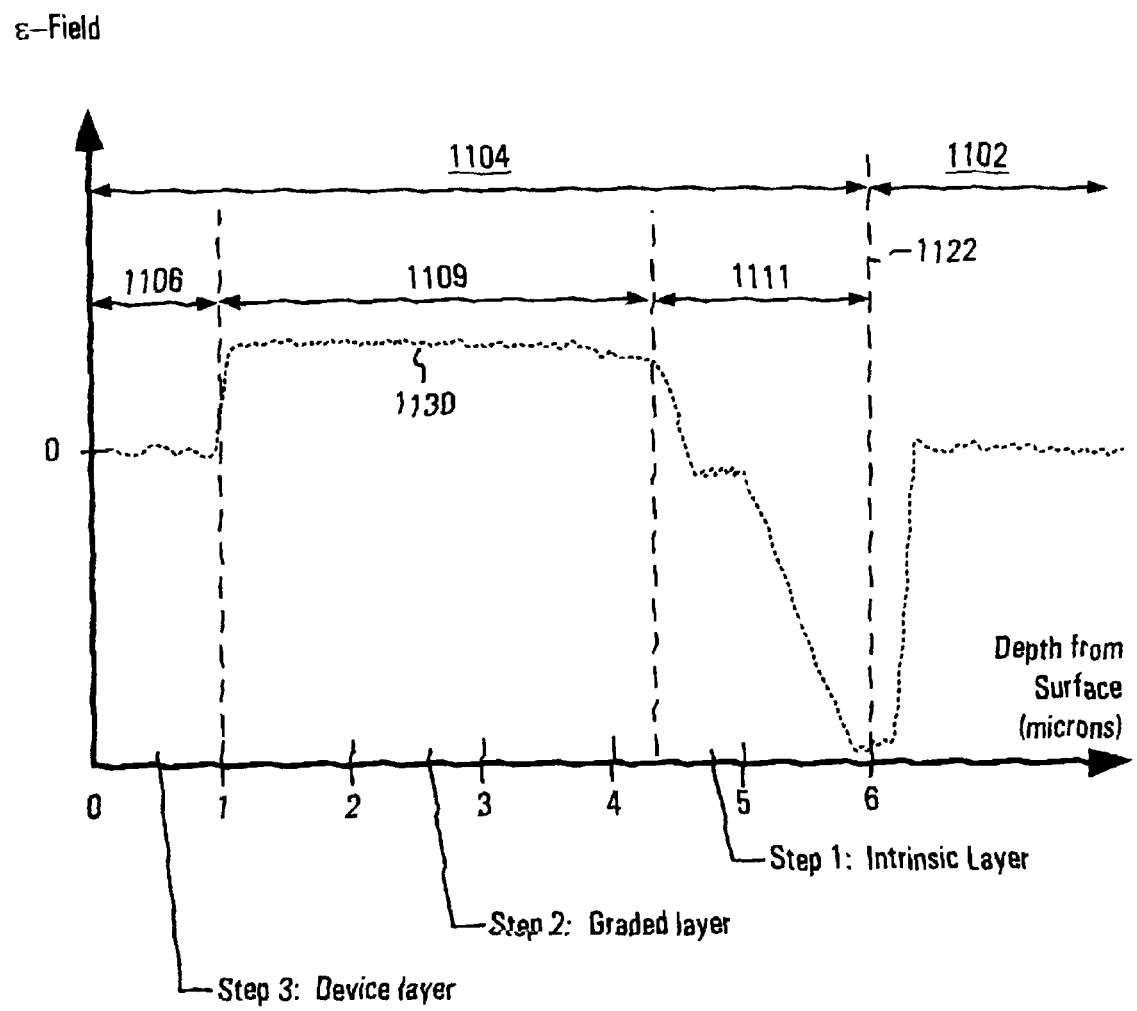
FIG. 11B is a diagram of the electric field that is achieved as a result of the graded profile such as may be present in an IC device with a graded epitaxial layer over a P− substrate depicted below in FIG. 11C in accordance with an exemplary embodiment of the present invention.

FIG. 11A is a diagram of a SRP (or series of SRPs) of a reduced SER epitaxial wafer indicating the dopant concentrations for a P+ substrate, intrinsic layer, graded layer and device layer in of a reduced SER epitaxial wafer in accordance with another exemplary embodiment of the present invention. The SRP depicted in FIG. 11A is identical to that of the SRP depicted in FIG. 10A with the exception of the inclusion of intrinsic layer 1111 between substrate 1102 and graded layer 1109. An undoped (intrinsic) effectively seals the highly doped P+ substrate. FIG. 11B is a diagram of the electric field that is achieved as a result of the graded profile such as may be present in an IC device with a graded epitaxial layer over a P+ substrate, and FIG. 11C is a cross-section of an IC device with a graded epitaxial layer with an undoped intrinsic layer over a P+ substrate in accordance with an exemplary embodiment of the present invention;

FIG. 12 is a flowchart of a process for building a reduced SER epitaxial wafer with a graded epitaxial wafer using an intrinsic layer over a P+ substrate in accordance with an exemplary embodiment of the present invention. The starting substrate can have a range of dopant levels depending on the requirements of the IC designer and manufacturer. For example, in the case of a P+ substrate (heavily doped p-type substrate), the substrate is first loaded into an epitaxial reactor (step 1202) and the ambient temperature is increased to the desired deposition temperature (step 1204). Any number of temperatures and silicon source gases can be used to grow the epitaxial layers and should be understood by an individual that is skilled in the art of epitaxial deposition. To achieve the maximum electric field, and therefore the highest efficiency in sweeping charge away from the active region, an undoped (intrinsic) layer of 1–2 microns in thickness is deposited over the P+ substrate (step 1206). This effectively seals the highly doped substrate. Following the intrinsic layer is the graded layer as described above with regard to FIGS. 9A–9B (step 1206). The graded layer can be formed by utilizing several deposition steps with incremental increases in p-type dopant flow, or by utilizing a ramping function for gas flow, as also discussed above. Depending on the desired resultant electric field, one of these options may be preferred over the other. The graded layer will result in a p-type dopant concentration that starts at an intrinsic level and ramps up to finish at the desired dopant level as specified by the IC manufacturing. This layer can be from 1–5 microns in thickness, but other thicknesses are also acceptable. Following the p-type graded layer is the deposition of the p-type device layer (step 1208). This final layer has a constant dopant concentration as specified by the IC manufacturer and is typically 2–4 microns in thickness, but other thicknesses are also acceptable. The gases are turned off, the temperature is reduced and the completed wafer is then removed from the chamber. These three layers (intrinsic, graded and device) may or may not be done utilizing one deposition process. The wafer is now ready for IC processing, such as that depicted in FIG. 11C.

Figure 13H:
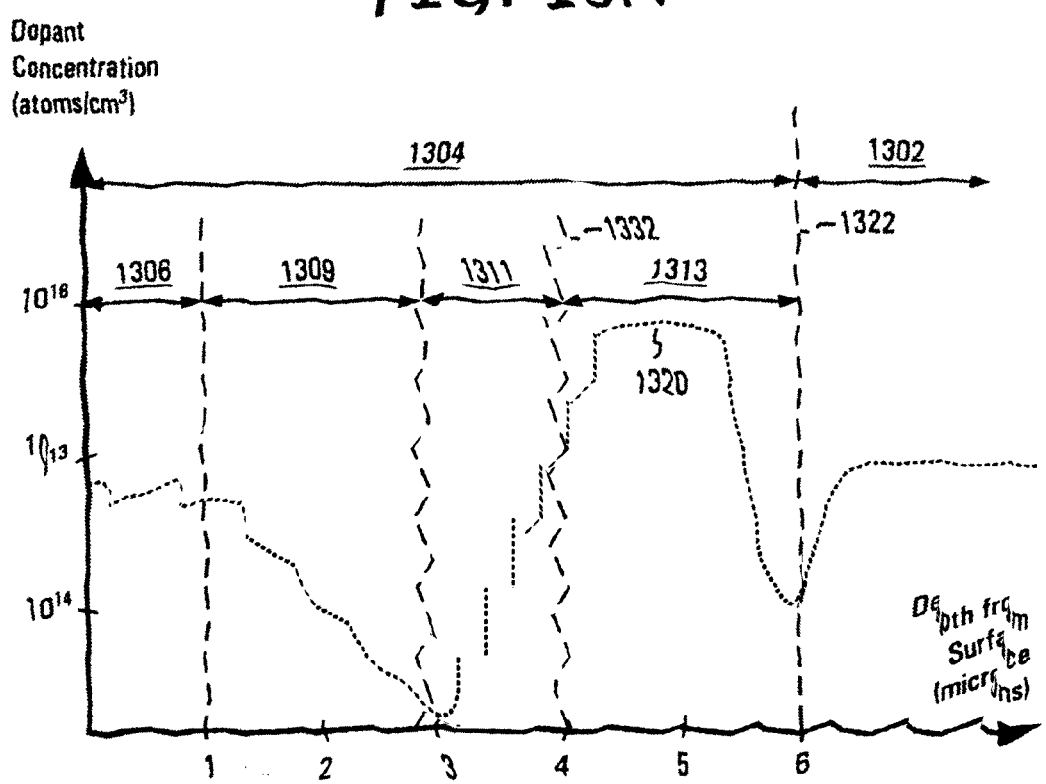
FIG. 13A is a diagram of a SRP (or series of SRPs) of a reduced SER epitaxial wafer indicating the dopant concentrations for a P− substrate, buried n-layer, intrinsic layer, graded layer and device layer in a reduced SER epitaxial wafer in accordance with an exemplary embodiment of the present invention.
FIG. 13B is a diagram of the electric field that is achieved as a result of the graded profile such as may be present in an IC device with a graded epitaxial layer with a buried n-layer as depicted below in FIG. 13C in accordance with an exemplary embodiment of the present invention.
FIG. 13C is a cross-section of an IC device with a graded epitaxial layer with a buried n-layer in accordance with an exemplary embodiment of the present invention.

In conjunction with the graded layer, an epitaxial layer of opposite dopant type of the graded layer and device layer can be deposited prior to the graded layer and device layer to form a vertical p/n junction below the graded layer and device layer in accordance with another exemplary embodiment of the present invention and as shown in FIG. 13C. The resultant p/n junction will prohibit charge flow from substrate 1302 migrating into epitaxial layer 1304. Therefore, charge generated in substrate 1302 as a result of an alpha particle, is prohibited from crossing into epitaxial layer 1304 and active device region 1406.

Figure 13B:
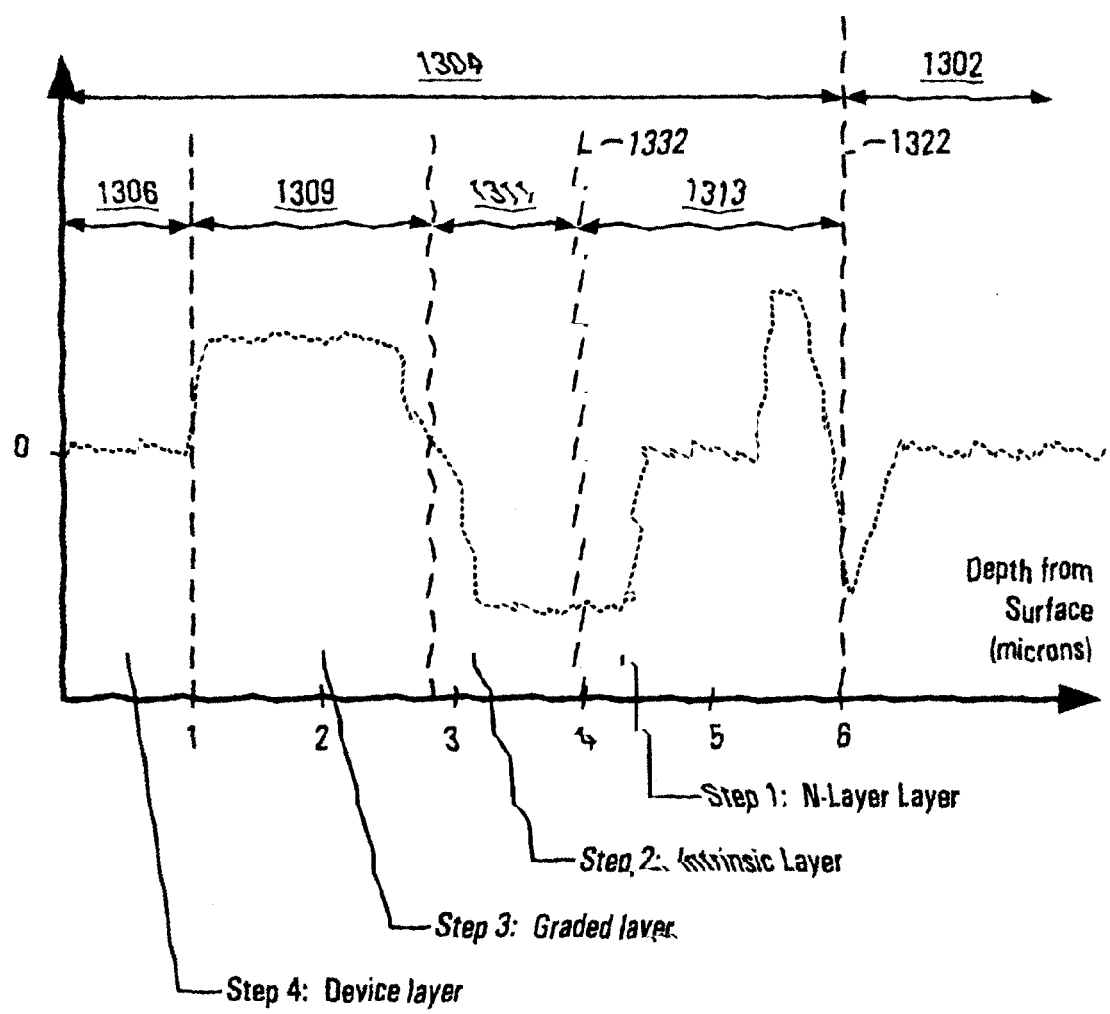

FIG. 13A is a diagram of a SRP (or series of SRPs) of a reduced SER epitaxial wafer indicating the dopant concentrations for a P– substrate, buried n-layer, intrinsic layer, graded layer and device layer in a reduced SER epitaxial wafer in accordance with an exemplary embodiment of the present invention. FIG. 13B is a diagram of the electric field that is achieved as a result of the graded profile such as may be present in an IC device with a graded epitaxial layer with a buried n-layer as depicted below in FIG. 13C, and as in accordance with an exemplary embodiment of the present invention.

Figure 14:
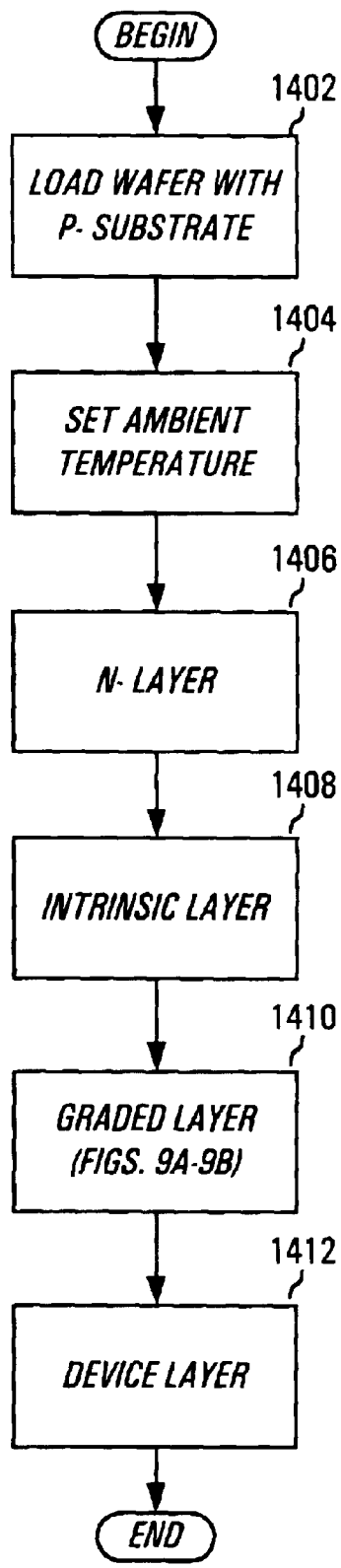
FIG. 14 is a flowchart of a process for building a reduced SER epitaxial wafer with a buried n-layer over a P− substrate in accordance with an exemplary embodiment of the present invention.

FIG. 14 is a flowchart of a method for processing a device layer on a graded layer on an n-type layer on a P– substrate for building a reduced SER epitaxial in accordance with an exemplary embodiment of the present invention. In creating a buried junction layer, the process is similar to the graded layer process described above, but includes the deposition of an initial layer of opposite dopant type. For example, in the case of a P– substrate (lightly doped p-type substrate), the substrate is first loaded into an epitaxial reactor (step 1402) and the ambient temperature is increased to the desired deposition temperature as discussed above (step 1404). An n-type layer is deposited onto the substrate (step 1406). This layer can have a range of dopant concentrations, but is typically moderately doped, and is 1–2 microns in thickness. Next, the undoped (intrinsic) layer of 1–2 microns in thickness is deposited over the n-type layer (step 1408). Following the intrinsic layer is the graded layer as described above with regard to FIGS. 9A–9B (step 1410). Following the p-type graded layer is the deposition of the p-type device layer (step 1412). This final layer has a constant dopant concentration as specified by the IC manufacturer and is typically 2–4 microns in thickness, but other thicknesses are also acceptable. These three layers (intrinsic, graded and device) may or may not be done utilizing one deposition process. The wafer is now ready for IC processing, such as that depicted in FIG. 14C.

Figure 15:
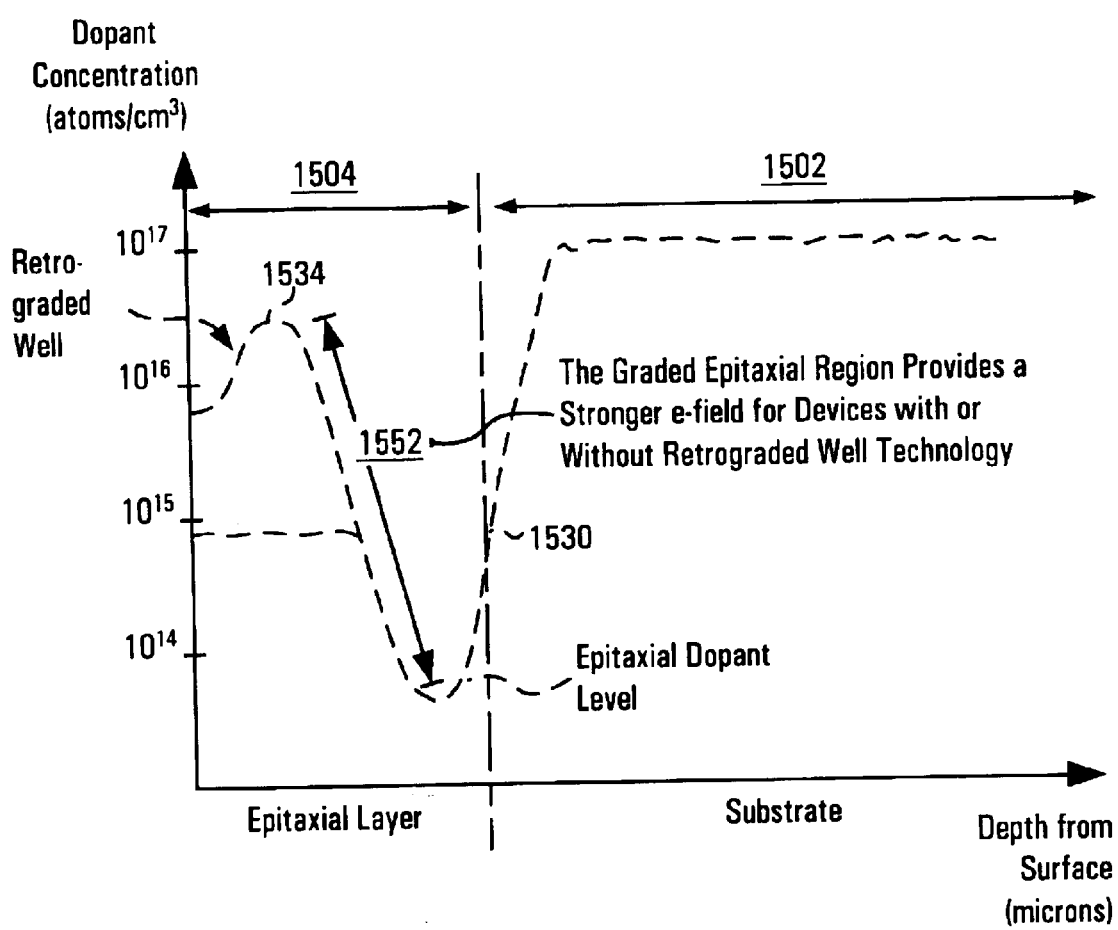
FIG. 15 is a SPR of a cross-section of device having a more effective design for SER by utilizing a reduced SER epitaxial wafer with retrograded well processing in accordance with an exemplary embodiment of the present ivnetion.

FIG. 15 is a diagram of a SRP of a retrograded well formed in a reduced SER epitaxial wafer showing that maximum grading is achieved for optimum SER protection using the exemplary fabrication processes in accordance with the present invention.

The two exemplary processes described above include: (1) p-type device layer on p-type graded layer on intrinsic layer on P+ substrate; and (2) p-type device layer on p-type graded layer on intrinsic layer on n-type buried layer on P– substrate. Upon reading the present disclosure, those of ordinary skill in the relevant art will readily understand their application to other areas or semiconductor processing. In addition to the exemplary embodiments described herein, any number of combinations of dopant type and dopant levels can be used to produce epitaxial layers with built-in electric fields that manipulate transient charge for improved device reliability and performance. One of ordinary skill in the art would readily understand and recognize various combinations of dopant type and dopant levels that can be used to produce epitaxial layers with, and without, a portion of the epitaxial layer having a graded dopant.

Those of ordinary skill in the art will also appreciate that the exemplary embodiments of the reduced SER epitaxial wafer in the same manner that they would use a standard epitaxial or non-epitaxial wafer. By building their device into the surface of the device layer of the reduced SER epitaxial wafer, they are modifying the dopant profile in that region. This is similar to their standard processing utilizing a standard epitaxial or non-epitaxial wafer. By using a reduced SER epitaxial wafer, however, there exists an electric field below the device layer to remove transient charge as described previously.

Figure 1:
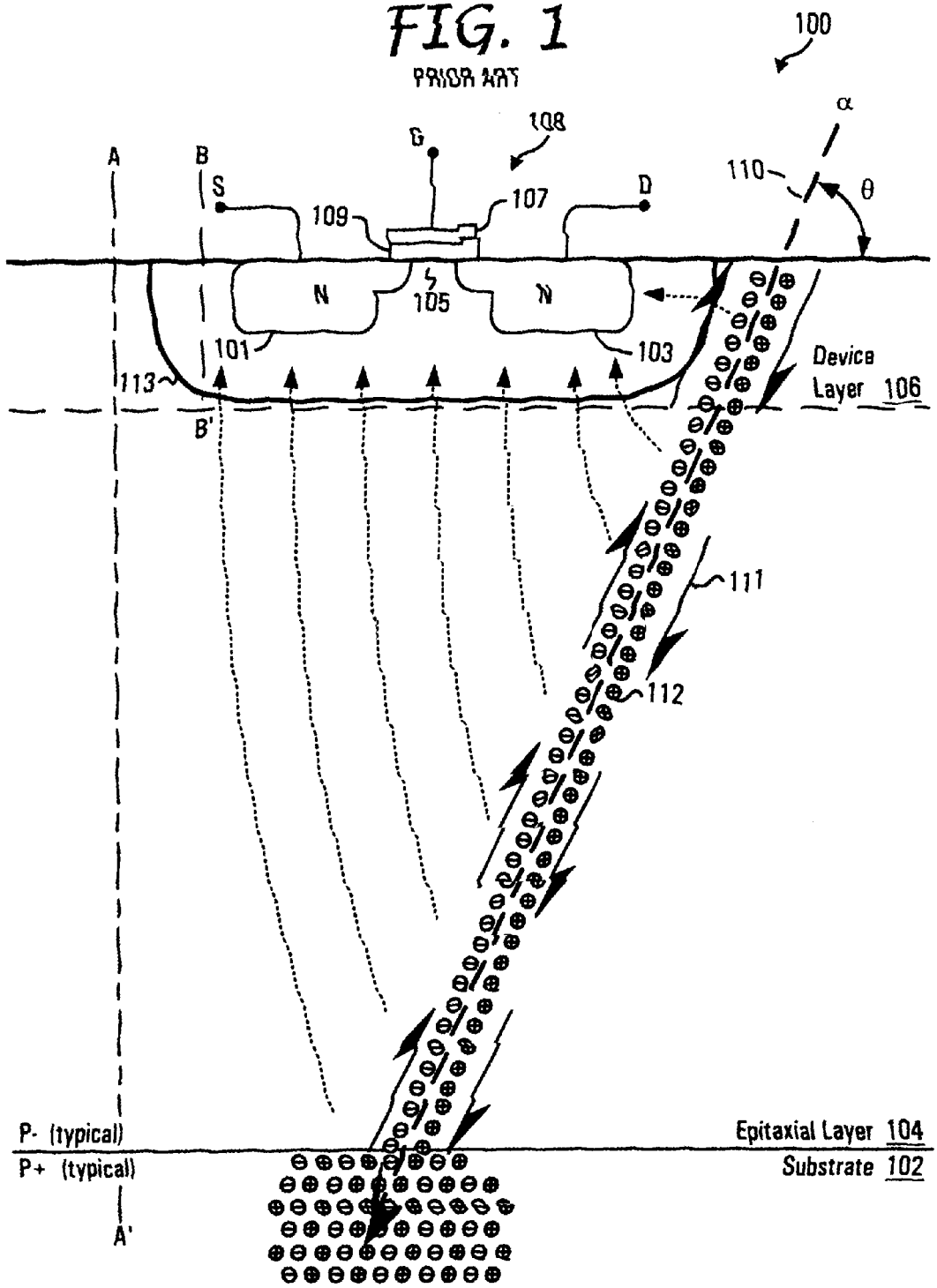
FIG. 1 is a cross-section of an IC device with an alpha particle passing through the epitaxial layer and into the substrate.
Figure 2:
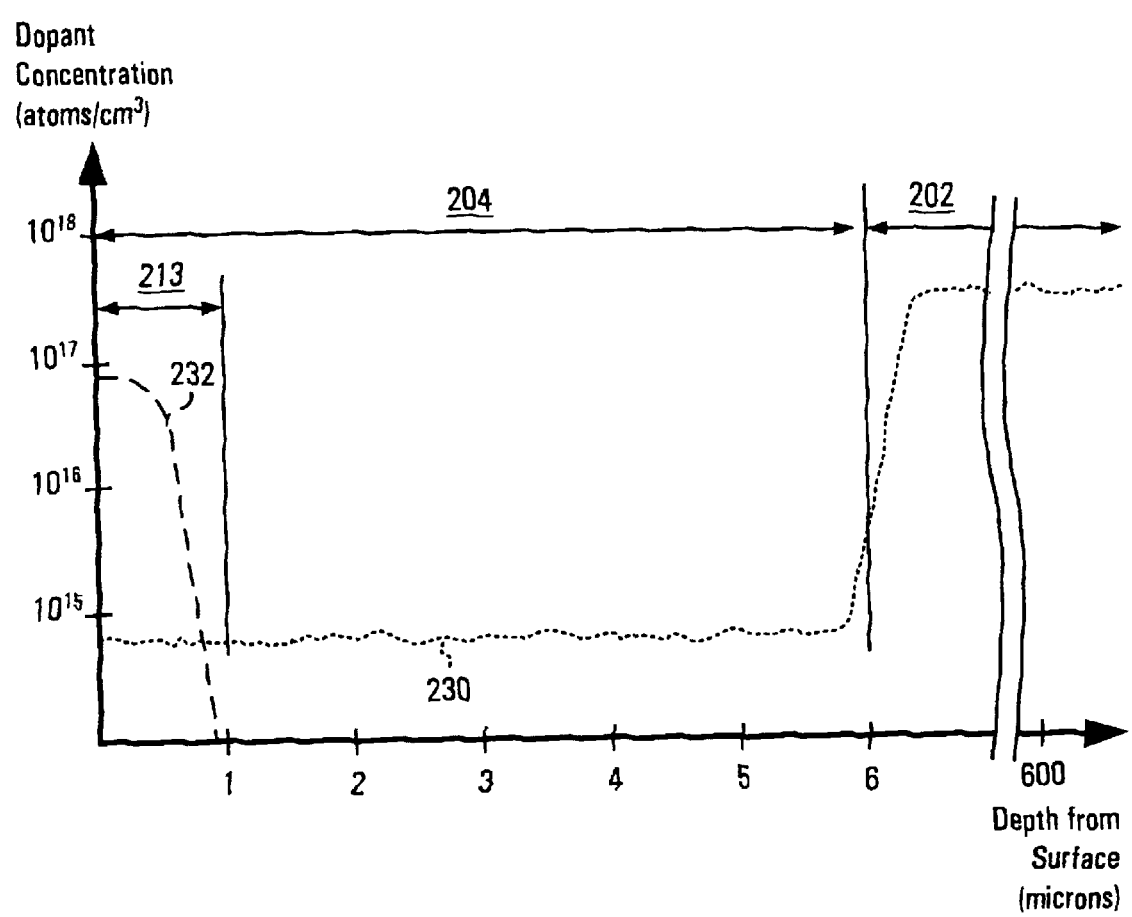
FIG. 2 is a diagram depicting a spreading resistance profile (SRP) of a wafer illustrating dopant concentrations throughout the thickness of the wafer as recognized by the Applicants of the present invention.
Figure 3:
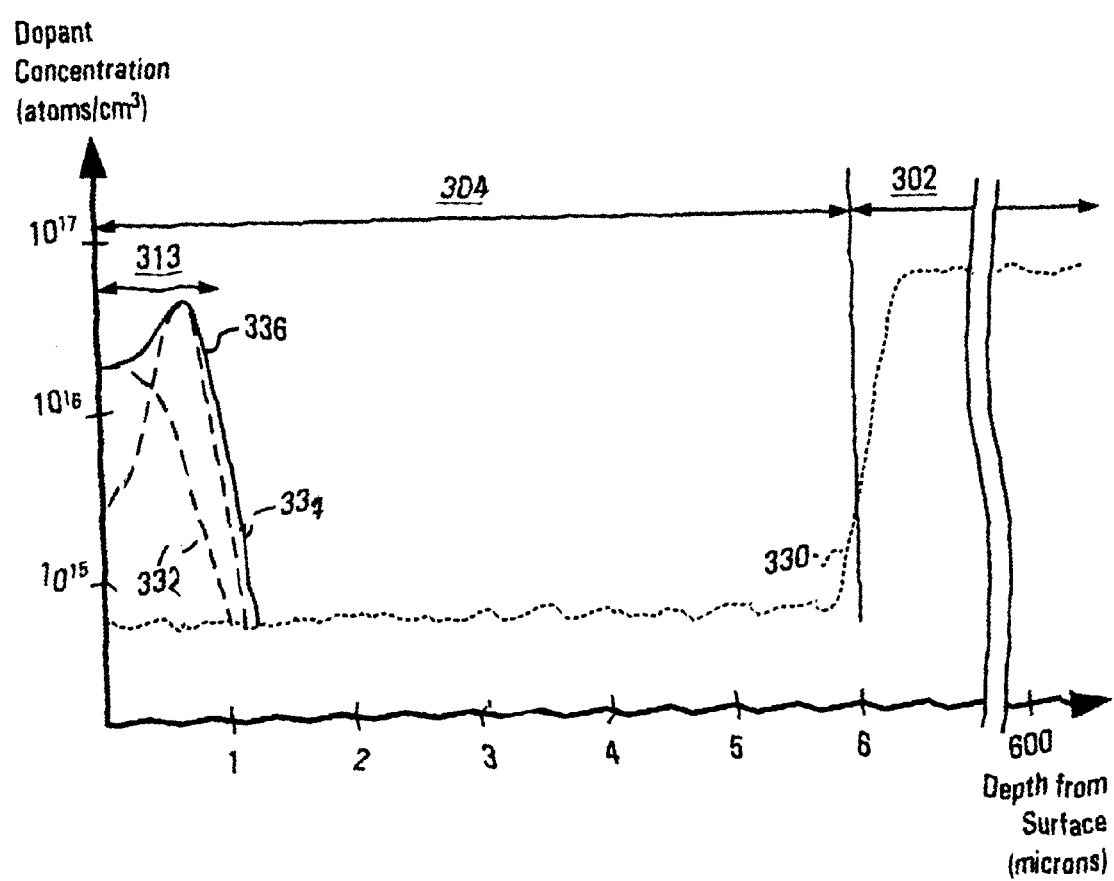
FIG. 3 is a diagram depicting a SRP resulting from typical IC manufacturing wherein dopants are introduced into the wafer surface resulting in a natural graded dopant profile below the dopant diffusion well as recognized by the Applicants of the present invention.
Figure 4:
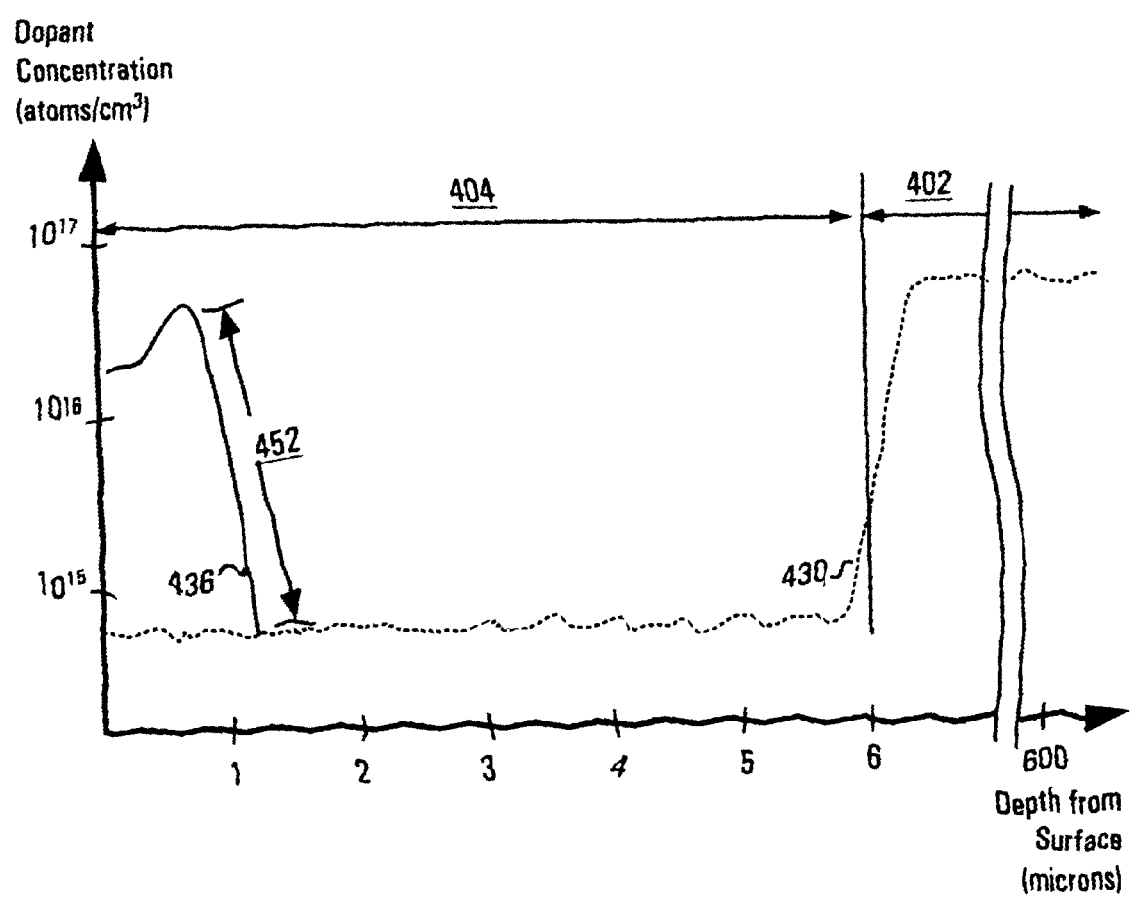
FIG. 4 is a diagram depicting a SRP of a retrograded well formed in a uniformly doped epitaxial layer indicating that the dopant grading may contribute to a reduction in SER as recognized by the Applicants of the present invention.
Figure 5:
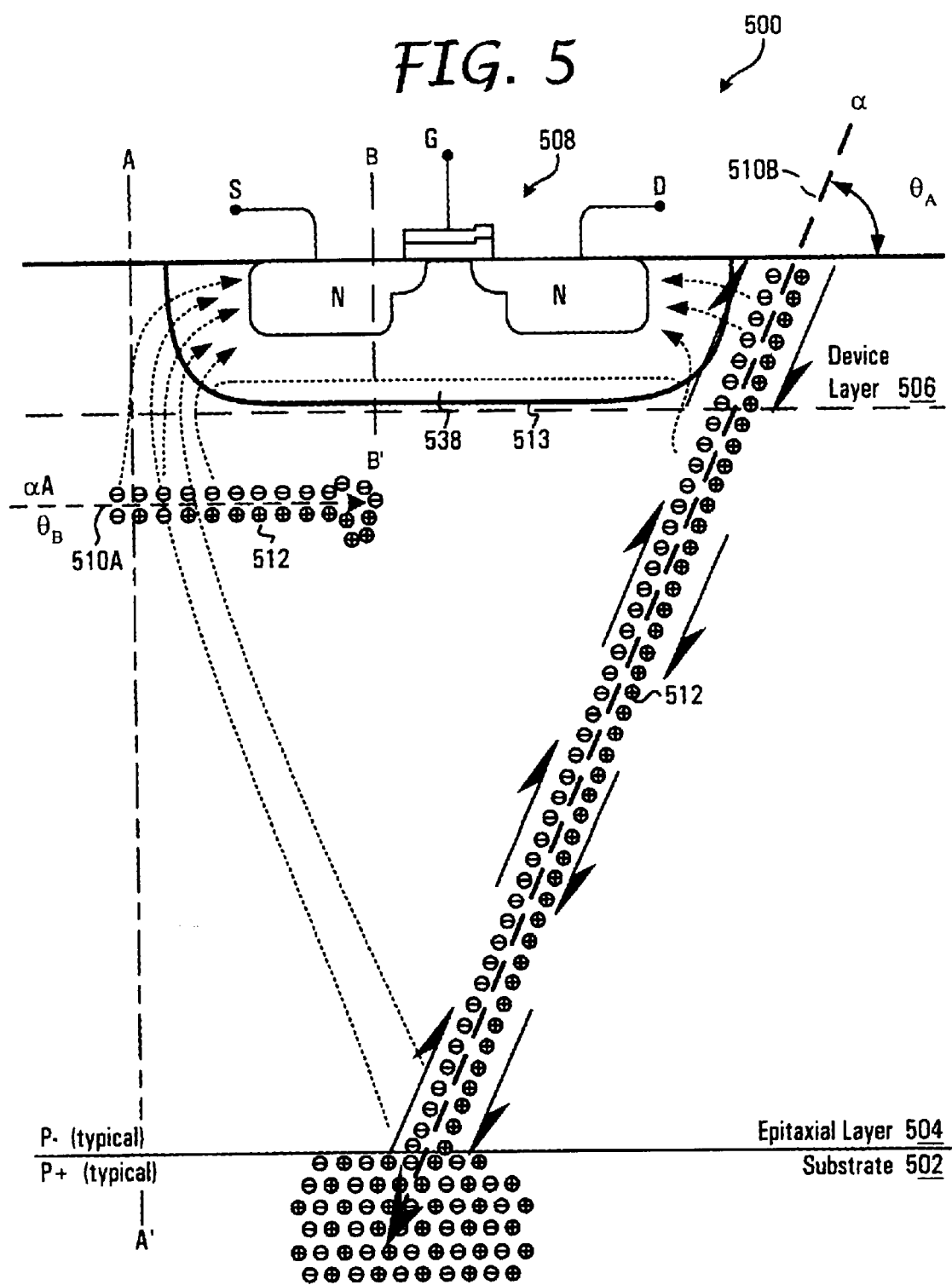
FIG. 5 is a cross-section of an IC device with a pair of particles passing through the semiconductor at different angles illustrating the shortcomings of prior art SER reduction techniques as recognized by the Applicants of the present invention.

Returning again to FIGS. 3 and 4, dopants introduced into the wafer surface can result in a natural graded dopant profile below the dopant diffusion well as described above with regard to FIG. 3 and dopant processes are known to specifically address soft errors as discussed above with regard to FIG. 4. However, these methods suffer from high design costs and charge leakage to the unprotected sides of devices (se again FIG. 5.) However, a more effective design for SER reduction is achieved by utilizing a reduced SER epitaxial wafer with retrograded well processing as depicted in FIG. 15. There, a well is ion diffused and retrograded in a well-known manner described above; however, rather than forming the well in an epitaxial layer with a constant dopant profile, a graded epitaxial layer is used. As can be seen from dopant profile 1530, the device layer is protected to substrate 1502. Moreover, the graded dopant profile may continue past the side of the well, thereby completely encapsulating the well from stray charges. Of course, not all devices to be formed in the epitaxial layer may tolerate the graded dopant, so this embodiment is device specific to those that will. Finally, the combination of graded dopant in the epitaxial layer and retrograded well design yields a dopant profile with extremely high SER protection characteristics. The benefit of retrograde well implant/grades epitaxial layer is graphically illustrated as margin 1552 which is a measure of the difference in resultant well dopant profile 1536 and graded dopant profile 1530. Still further, by comparing magnitude 452 for a retrograde well implant, shown in FIG. 4, with that of margin 1552 for the retrograde well and graded epitaxial layer, it is clear that even the protection for the underside of the well is increased substantially.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconducting structure having reduced with soft error rates comprising:
   a semiconductor substrate;
   a first semiconductor layer over the substrate, said first semiconductor layer being comprised of a first semiconductor material and having a vertical extent defined by an upper extent of the first semiconductor material and a lower extent of the first semiconductor material;
   a generally constant electric field across at least a portion of the vertical extent of the first semiconductor material, wherein a charge which occurs within the first semiconductor layer is influenced toward the semiconductor substrate; and
   a device layer in which a semiconductor device may be fabricated.

2. The semiconducting structure recited in claim 1 above, wherein the first semiconductor layer over the substrate further comprises a graded dopant concentration over the at least a portion of the vertical extent of the first semiconductor material, said graded dopant concentration having a first dopant concentration established at the lower extent of the semiconductor material, a second dopant concentration established at the upper extent of the semiconductor material and a plurality of dopant concentrations between said first dopant concentration and said second dopant concentration over the at least a portion of the vertical extent of the first semiconductor material, and between the upper extent and lower extent of the first semiconductor material.

3. The semiconducting structure recited in claim 2 above, wherein said second dopant concentration is based on said semiconductor device to be fabricated in the device layer.

4. The semiconducting structure recited in claim 2 above, wherein said device layer is formed within the vertical extent of first semiconductor material.

5. The semiconducting structure recited in claim 3 above further comprises:
   a second electric field formed at the lower extent of the first semiconductor material.

6. The semiconducting structure recited in claim 5 above, wherein the second dopant concentration is further based on a dopant concentration of said semiconductor substrate, wherein said second dopant concentration is different from said dopant concentration of said semiconductor substrate.

7. The semiconducting structure recited in claim 3 above further comprises:
   a second electric field below the first semiconductor material.

8. The semiconducting structure recited in claim 7 above, wherein said semiconductor substrate is a P+ semiconductor substrate, and said semiconducting structure further comprises:
   an undoped intrinsic layer formed over said P+ semiconductor substrate and under said first semiconductor layer.

9. The semiconducting structure recited in claim 7 above, wherein said semiconductor substrate is a P− semiconductor substrate, and semiconducting structure further comprises:
   a buried n-layer formed over said P− semiconductor substrate; and
   an undoped intrinsic layer formed over said buried n-layer and formed under said first semiconductor layer.

* * * * *